(12) United States Patent
Erdeljac et al.

(10) Patent No.: US 6,284,617 B1
(45) Date of Patent: Sep. 4, 2001

(54) METALIZATION OUTSIDE PROTECTIVE OVERCOAT FOR IMPROVED CAPACITORS AND INDUCTORS

(75) Inventors: John P. Erdeljac, Plano; Louis Nicholas Hutter, Richardson, both of TX (US); M. Ali Khatibzadeh, Cary, NC (US); John Kenneth Arch, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/776,511

(22) Filed: Feb. 2, 2001

Related U.S. Application Data

(62) Division of application No. 09/183,821, filed on Oct. 30, 1998, now Pat. No. 6,236,101.
(60) Provisional application No. 60/064,865, filed on Nov. 5, 1997.
(51) Int. Cl.[7] .................................................. H01L 21/20
(52) U.S. Cl. ........................................... 438/381; 438/393
(58) Field of Search ............................... 438/3, 238–240, 438/390–396, 381, 393–399

(56) References Cited

U.S. PATENT DOCUMENTS

| | | | |
|---|---|---|---|
| 5,071,518 | 12/1991 | Pan | 205/122 |
| 5,240,879 | 8/1993 | DeBruin | 437/190 |
| 5,744,832 | * 4/1998 | Wolters et al. | 257/76 |

OTHER PUBLICATIONS

Culbertson et al., "Evolution of RFMOS™ Power Amplifiers for High Efficiency Digital Cellular Applications," Texas Instruments, Dallas, Texas, Publishing date unknown.

Brauchler et al., "Performance of RFMOS™ for 1.9 GHz CDMA Operation," IEEE MTT-S International Microwave Symposium, Jun. 1998.

Khatibzadeh et al., "RF Technology Trends in Digital Wireless Communications," Texas Instruments, Dallas, Texas, Publishing date unknown.

* cited by examiner

Primary Examiner—Jey Tsai
(74) Attorney, Agent, or Firm—Wade James Brady, III; Frederick J. Telecky, Jr

(57) ABSTRACT

A thick layer of copper is formed on the outside the protective overcoat (PO) which protects an integrated circuit, and forms both an inductor and the upper electrode of a capacitor. Placing this layer outside the PO greatly reduces parasitic capacitances with the substrate in the devices.

1 Claim, 24 Drawing Sheets

METALIZATION OUTSIDE PROTECTIVE OVERCOAT FOR IMPROVED CAPACITORS AND INDUCTORS

This is a Divisional application of Ser. No. 09/183,821, filed Oct. 30, 1998 now U.S. Pat. No. 6,236,101.

CROSS-REFERENCE TO RELATED APPLICATION

This application claims priority from a provisional application, Ser. No. 60/064,865, filed Nov. 5, 1997, which is hereby incorporated by reference. However, the content of the present application is not identical to that of the priority application.

BACKGROUND AND SUMMARY OF THE INVENTION

The present invention relates generally to electronic circuits, especially to radio frequency (RF) MOS devices, having improved capacitors and inductors. A schematic diagram of an RF-MOS circuit is shown in FIG. 26.
Background: Inductors One of the basic problems in integrating inductors into semiconductor devices is the parasitic capacitances which are produced between the inductor and the substrate. A typical inductor is formed by taking the layers of metallization, tying them all together and stacking them. However, since the first layer of metallization is close to the substrate, a large capacitance is formed between the inductor and the substrate. In order to maximize the Q value, (the ratio of the inductive reactance to its effective series resistance), it is preferable that the inductor be as far away from the substrate as possible. Furthermore, it is desirable for the metal line of the inductor to have some height so that there will be magnetic coupling between the coils. With aluminum wiring, the metals are thin because it is difficult to planarize the wires if it is very thick. Hence, each metallization layer is quasi-planar, so the inductors are wound with flat spirals which results in magnetic flux leaking out.
Background: Capacitors Usually, capacitors constructed within integrated circuit (IC) chips use one of the following combinations to form the plates of the capacitors: a) the substrate and a polysilicon layer, b) two separate polysilicon layers, or two different metallization layers. One problem with these capacitors is that their location inside of the package allows capacitive coupling to the substrate. Additionally, the poly-poly capacitor has inherent series resistance in each plate.
Innovative Structures and Methods The present application discloses formation of an integrated inductor and an integrated capacitor using a thick copper layer on the outside of the protective overcoat. This has the advantage of removing the inductor as far from the substrate as possible, thereby reducing the parasitic capacitances. Using a thick copper layer outside the protective overcoat also has the advantage of using the free area above the package to construct a capacitor, which additionally has a low series resistance. Furthermore, because both the inductor and the capacitor can be constructed outside the protective overcoat, radio frequency (RF) drive circuits can be constructed outside the chip.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 1a through 21a depict stages in the disclosed process for fabrication of an RFMOS Power Transistor.

FIGS. 1b through 21b depict stages in the disclosed process for fabrication of a poly-0/poly-1 capacitor and a poly-0 resistor as well as a high-Q-value metal top capacitor and a poly-1 to deep-p shunt capacitor.

FIGS. 1c through 21c depict stages in the disclosed process for fabrication of a metal top inductor.

DETAILED DESCRIPTION OF THE PREFERRED EMBODIMENTS

Figure 1A:
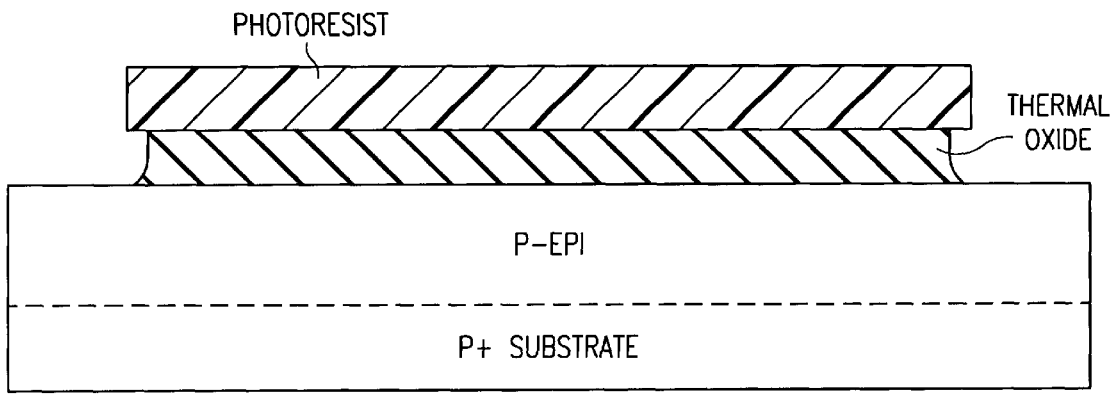

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Definitions

Following are some of the technical terms which are used in the present application. Additional definitions can be found in the standard technical dictionaries.

Contact: An approximately vertical connection from metallization to a semiconductor layer (whether a gate line or a source/drain diffusion), possibly including a barrier layer to separate the metal from the semiconductor.

Contact Resistance: The resistance of a contact, or more generally the inverse of the conductance per unit area of a given contact interface. Units are ohms times area.

Control Gate: The upper gate of a floating-gate memory cell. By applying an appropriate voltage to the control gate and observing the current passed by the transistor, the state of the cell (i.e. whether charge is stored on the floating gate) can be detected.

Current Leakage: Current leakage, or leakage current, is current that escapes from the device by means other than that intended, such as through parasitic bipolar action.

Diffusion: The process of diffusion is the spontaneous movement of dopant or impurity atoms through a semiconductor, at a rate which depends on temperature and on the particular elements involved. The noun "diffusion" usually refers to a doped portion of a semiconductor material.

Diffusion Barrier: A material in which impurities have a low diffusion constant. For example, titanium nitride is often used as a conductive diffusion barrier material in silicon integrated circuit technology.

Dopant: An atom added to a semiconductor, which, when activated, provides a "carrier" (i.e. an electron or hole) which can move around in the semiconductor to enable the flow of current. For example, in silicon technology, boron or gallium can act as P-type dopants (or "acceptors"), and phosphorus, arsenic, or antimony can act as N-type dopants (or "donors").

Drain: In a field-effect transistor, the diffusion to which majority carriers are emitted. For example, in an NMOS transistor, the drain will often be found connected to the more negative supply voltage (e.g. ground). In a PMOS transistor, the source will often be found connected to a positive power supply voltage.

Gate: In a field-effect transistor, the electrode to which a control voltage is applied to modulate the conduction of the transistor.

N-channel: A channel of n-type semiconductor material induced in a FET as a result of a bias applied to the gate. This channel allows current to flow from the drain to the source of an NMOS transistor. Typically an N-type channel is formed by surface inversion of p-type material, but it may also be formed by surface enhancement of n-type material.

N-type: A volume of semiconductor which normally includes an excess of electrons. This can be achieved by introduction of "donor" dopants (such as phosphorus, arsenic, or antimony in silicon).

P-type: A volume of semiconductor which normally includes an excess of holes. This can be achieved by introduction of "acceptor" dopants (such as boron or gallium in silicon).

PMD (pre-metal dielectric)—a dielectric layer between the polysilicon gate/interconnect level and the lowest metal layer (which is conventionally referred to as "Metal 1"). (Sometimes the term "multilevel oxide", or "MLO," is used instead of PMD.) The dielectric layers between metal levels are called intermetal dielectrics. (Sometimes the term "interlevel dielectric", "ILD", "interlevel oxide", "ILO" is used instead.) The intermetal dielectric between Metal 1 and Metal 2 is designated as DM1, etc. Contact holes are openings in the PMD. Openings in the intermetal dielectric are called vias—these allow contact to be made between Metal 1 and Metal 2, Metal 2 and Metal 3, etc.

PMOS: A pchannel field effect transistor, or a circuit or chip containing this type of transistor.

POLY: Originally engineering slang for polysilicon, this term (or the related terms POLY1, POLY2, POLY3, POLY4) also refers to a patterned conductor level which provides transistor gates, resistors, or sometimes TFT transistor channels.

Polycide: A composite of polycrystalline silicon and a metal silicide.

Polysilicon: Polycrystalline silicon.

Resistivity: A measure of the resistance of a given material. Units are ohms times length.

Semiconductor: A material which is less conductive than a metallic material, but more conductive than an insulator. (More precisely, a semiconductor will have a nonzero "bandgap" between its valence and conduction bands, which is no more than a few electron volts at the very most.) The most frequently used semiconductor material is silicon, but there are many others, including gallium arsenide (or "GaAs"), silicon-germanium, mercury cadmium telluride, indium phosphide, gallium-indium arsenide-phosphide, and silicon carbide.

Sheet Resistance: The resistance of a square resistor, made from a given thin-film material, which has contacts on two opposite sides.

Via: An approximately vertical connection from one metallization layer to another.

For definitional purposes, the first-deposited polysilicon layer is herein referred to as the poly-0 layer, while the gate layer, which is formed from the second-deposited polysilicon layer, retains its traditional reference as poly-1.

Overview of High-Q Capacitor

The high-Q capacitor has a first electrode formed in metal-2 and a second electrode formed from a thick metal layer outside of the protective overcoat, so it has an inherent low series resistance in each plate. The dielectric for this capacitor is a deposited oxide, with the thickness determined by the voltage requirements for the specific use. The area of the capacitor is defined by the area of the via opening which is etched through the protective overcoat.

The capacitor sits on top of the field oxide, the MLO, and the ILO, placing this capacitor as far from the silicon substrate as possible, reducing its parasitic capacitance to the substrate. For these reasons (low series resistance and low parasitic capacitance) this capacitor provides improved radio frequency (RF) performance.

The following are some of the parameters for the high-Q capacitor in the presently preferred embodiment, though these are to be taken as an example only, not as limitations:

Capacitor Area=64 um×144 um
C @ 900 MHz=6.0 pF
Q @ 900 MHz=22.8
C @ 1900 MHz=8.8 pF
Q @ 1900 MHz=5.5
Self-resonance f=3.6 GHz Overview of Inductor The inductor is formed on the outside of the protective overcoat (PO), using the thick copper layer discussed above to create the coils. By placing this outside the PO, the inductor is as far away from the substrate as possible, reducing substrate coupling and inductor losses. Additionally, copper has a lower resistance than aluminum, and in this application is formed in much thicker layers than typical aluminum layers, increasing the magnetic coupling between the coils.

Presently, a square spiral is used for the inductor, but this can also be formed as a circular spiral. The center of the spiral is connected to metal-2 through a via.

The following are some of the parameters for the inductor in the presently preferred embodiment, though these are to be taken as an example only, not as limitations:

# of turns=2.5
Total length of line=3.7 mm
Copper width=space=20 um
Copper height=11 um
L @ 900 MHz=4.5 nH
Q @ 900 MHz=4.9
L @ 1900 MHz=5.0 nH
Q @ 1900 MHz=3.5
Self-resonance f=4.2 GHz Process Flow The disclosed processes and structures will now be described with reference to FIGS. 1(a) through 21(c). In particular, the figures labeled (a) detail the fabrication of a power transistor, the figures labeled (b) show the fabrication of passive components including a high-Q metal-top capacitor, a poly-0/poly-1 capacitor, a poly-0 low temperature coefficient resistor and a poly-1 to deep-p shunt capacitor, and the figures labeled (c) detail the fabrication of a metal top inductor.

Figure 19A:
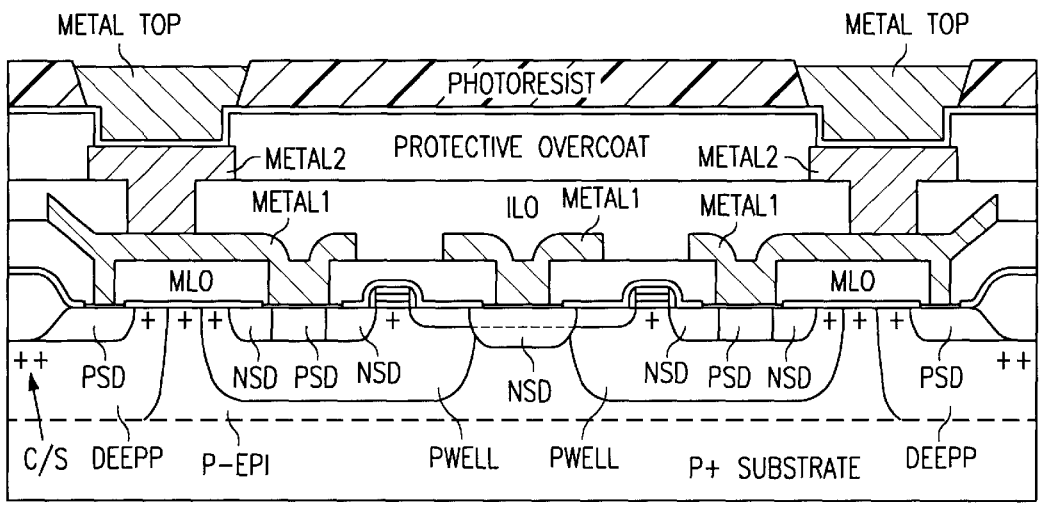
Figure 19B:
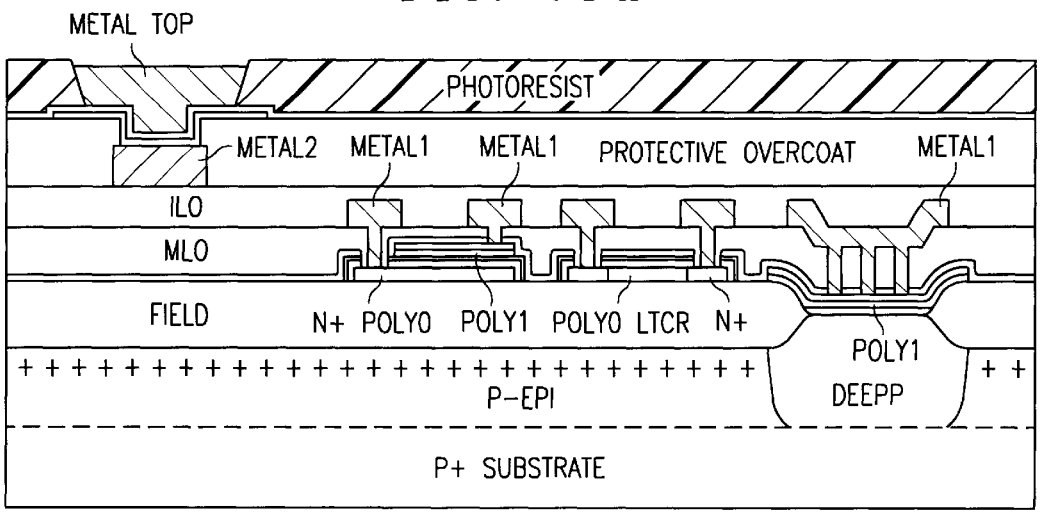
Figure 19C:
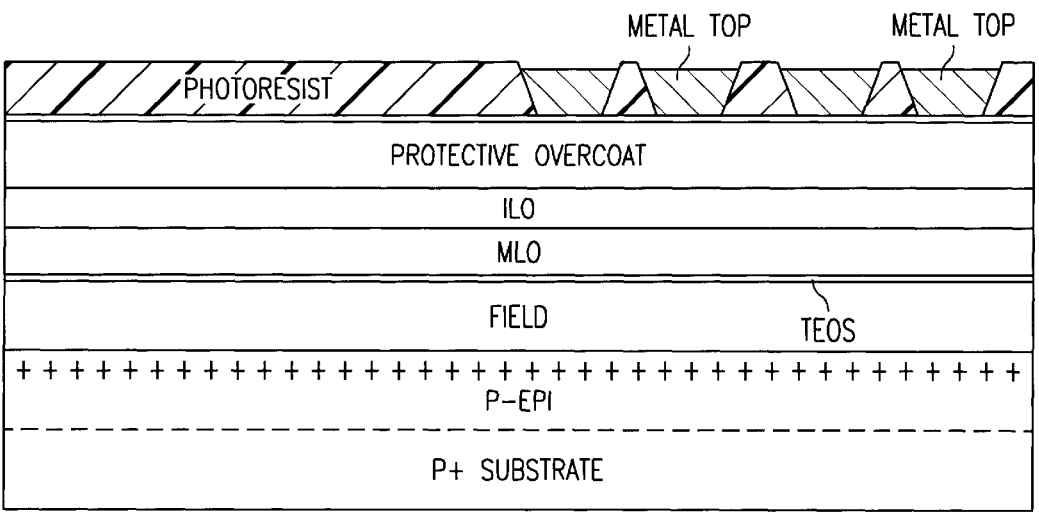
Figure 20A:
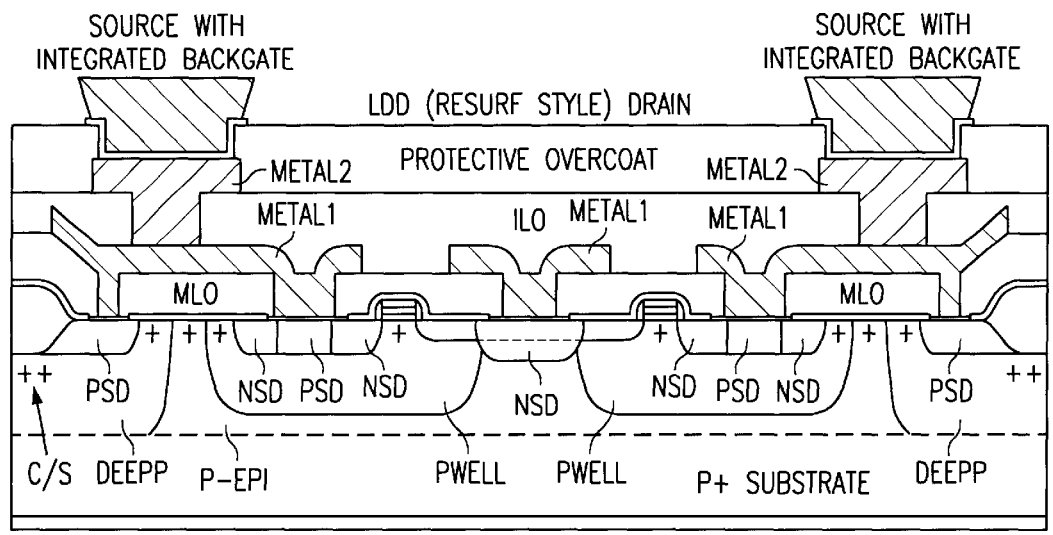
Figure 20B:
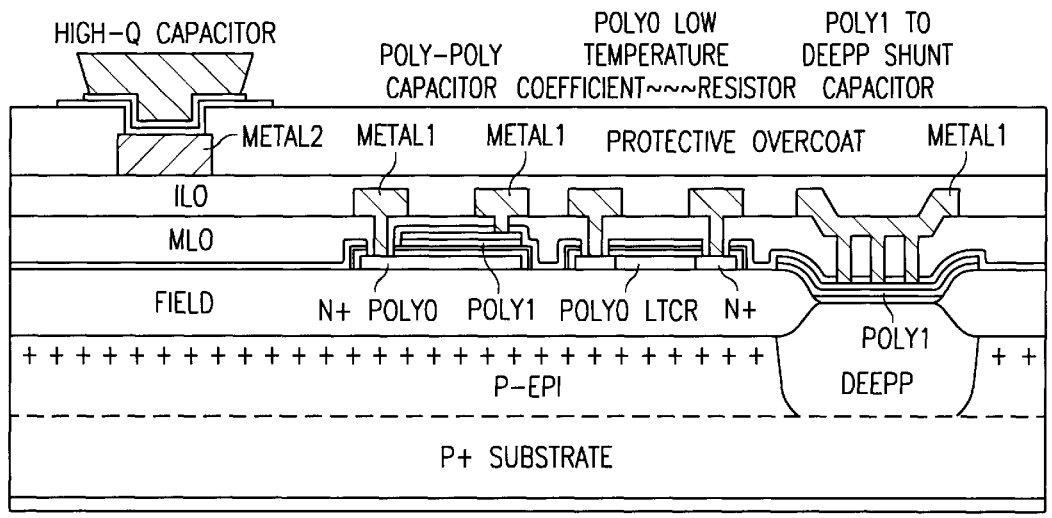
Figure 20C:
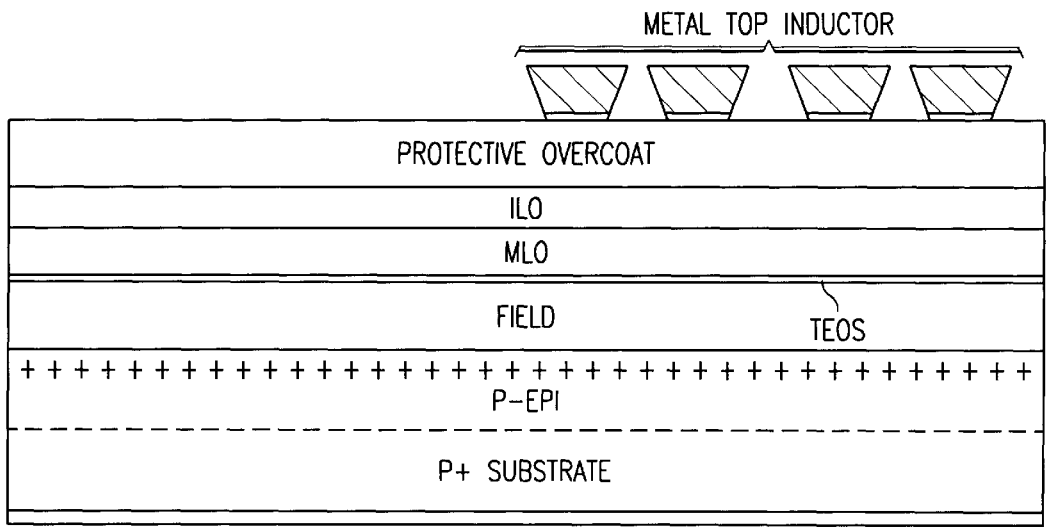

FIGS. 19(c) and 20(c) are of particular relevance to the fabrication of a metal top inductor.

FIGS. 16(b) through 20(b) are of particular relevance to the fabrication of a high-Q capacitor.

Isolation and Wells

Figure 1B:
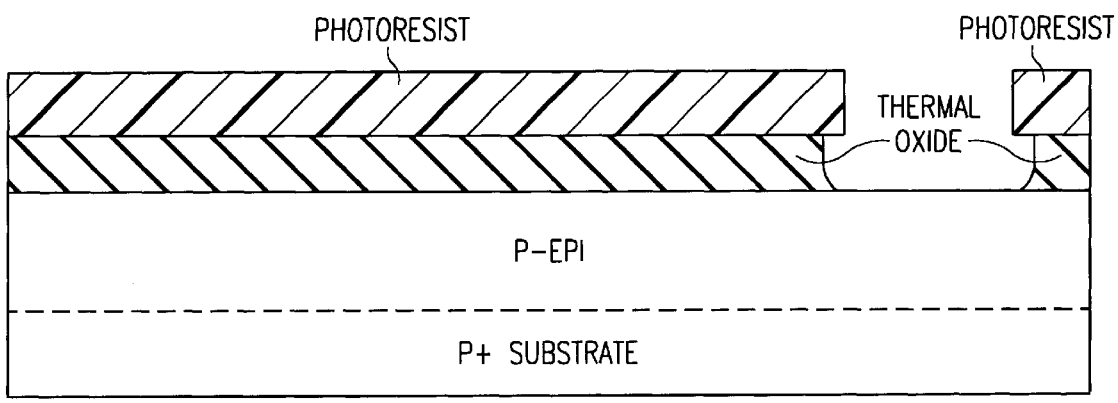
Figure 1C:
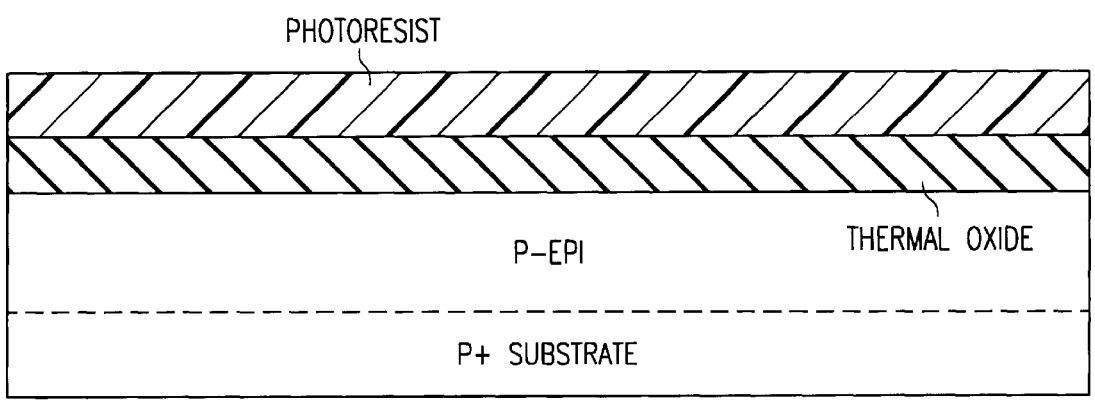

In FIGS. 1(a–c), an epitaxial layer is formed over the original p+ substrate, followed by a short oxidation to form a thin, protective oxide. A layer of photoresist is deposited and patterned to expose regions where deep-p wells are desired, and the oxide is removed in these areas by a wet etch.

Figure 2A:
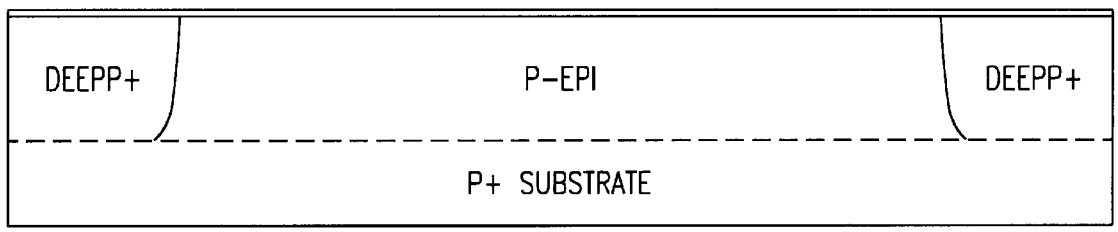
Figure 2B:
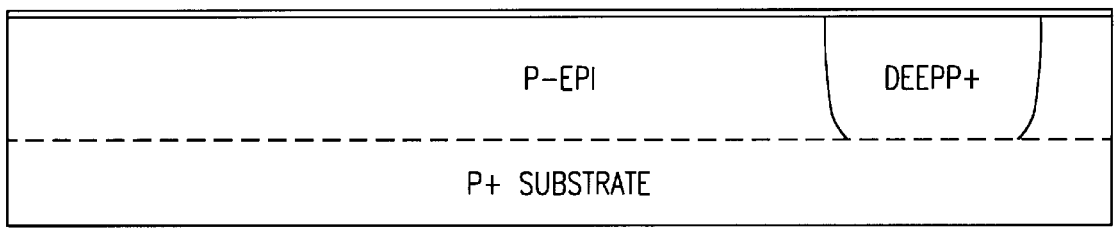
Figure 2C:
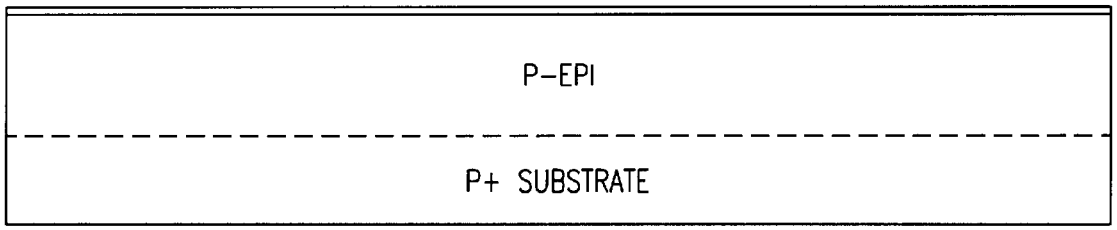

Referring to FIGS. 2(a–c), a p+ type material, e.g. boron, is deposited and diffused to create a deep p-type diffusion region. This is followed by ashing of the photoresist and removal of the protective oxide, followed by a new pad oxidation. The deep-p layer is used to obtain a low resistance connection to the backside of the p+ starting wafer and is connected to the source of the power transistor through metallization.

Figure 3A:
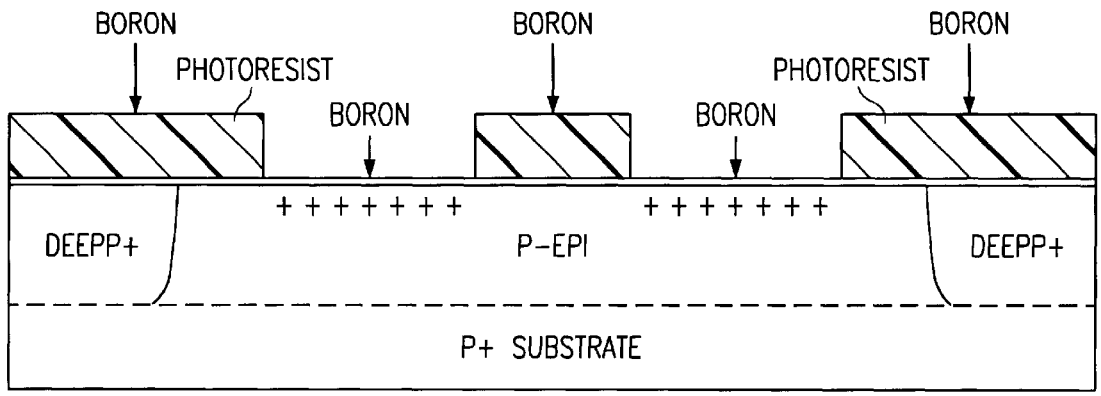
Figure 3B:
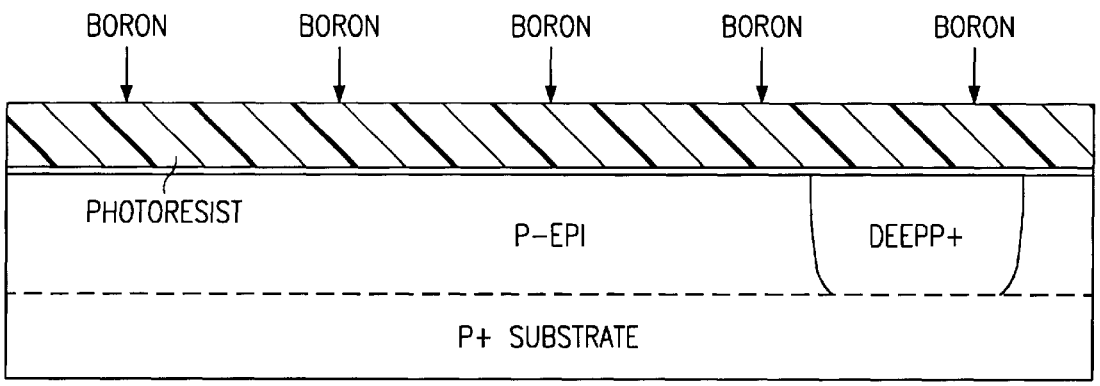
Figure 3C:
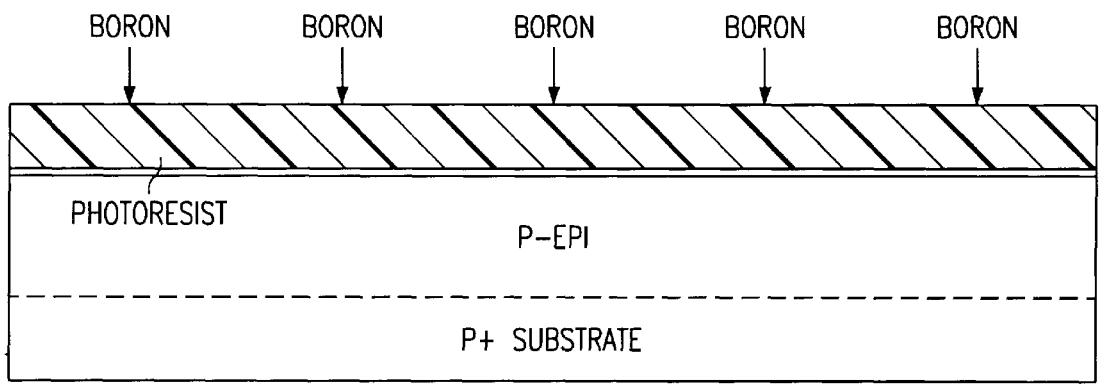
Figure 4A:
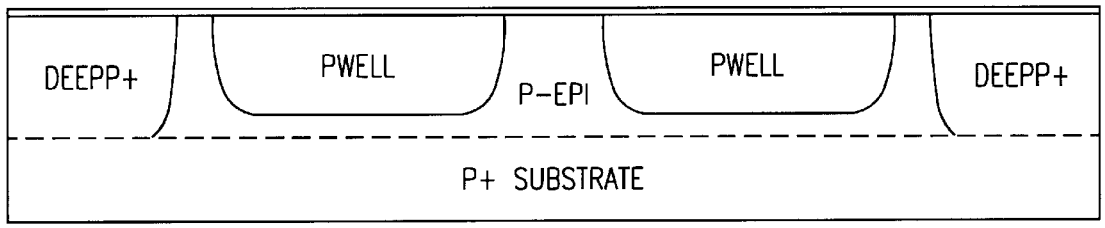
Figure 4B:
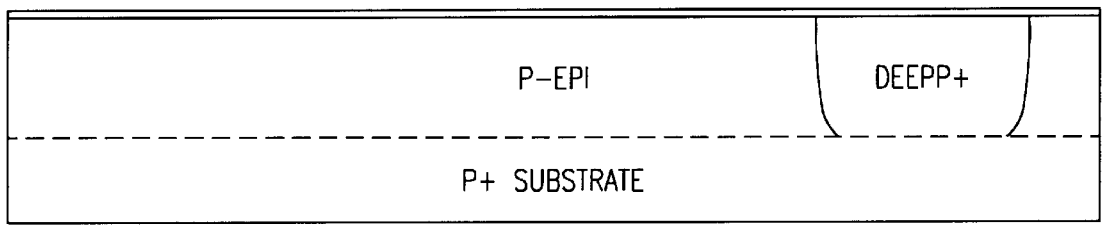
Figure 4C:
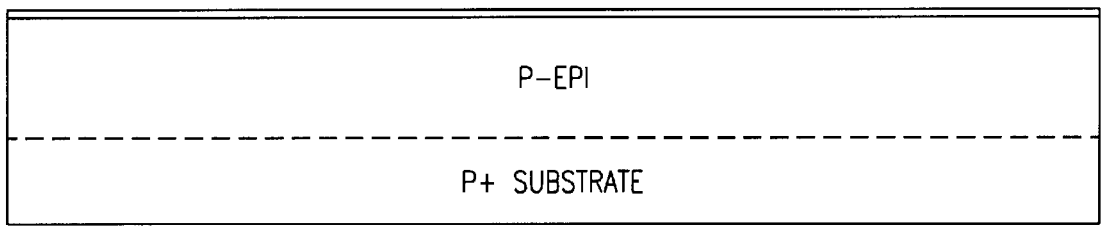

To achieve the structure depicted in FIGS. 3(a–c), a photoresist mask is deposited and patterned to expose desired p-well regions, and the chip is ion bombarded with boron. Following ion bombardment, the photoresist is ashed, the boron diffuses through the epitaxial layer to create p-wells, and a new pad oxidation is performed to create the device depicted in FIGS. 4(a–c).

Figure 5A:
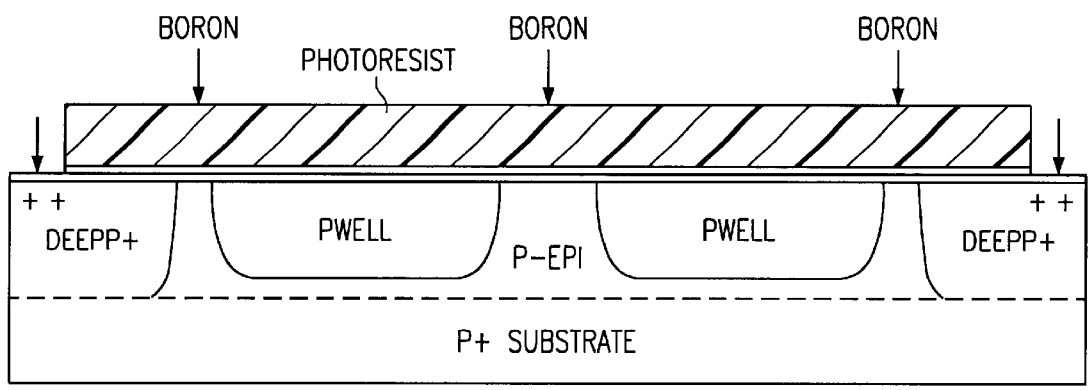
Figure 5B:
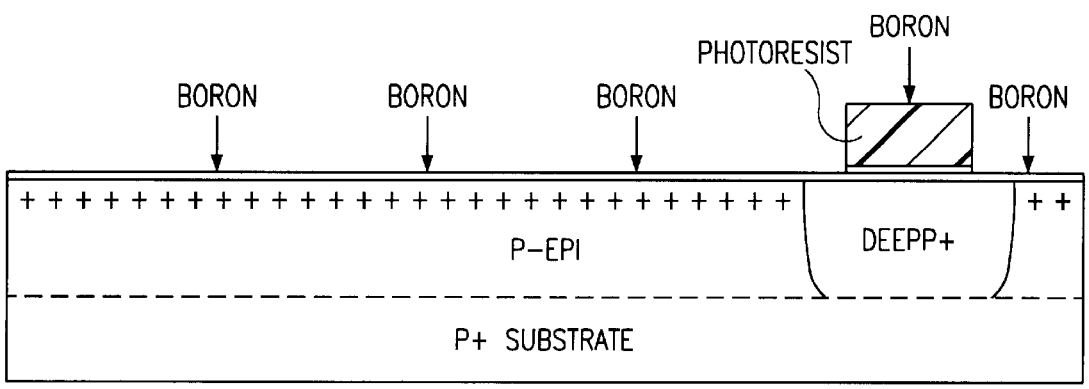
Figure 5C:
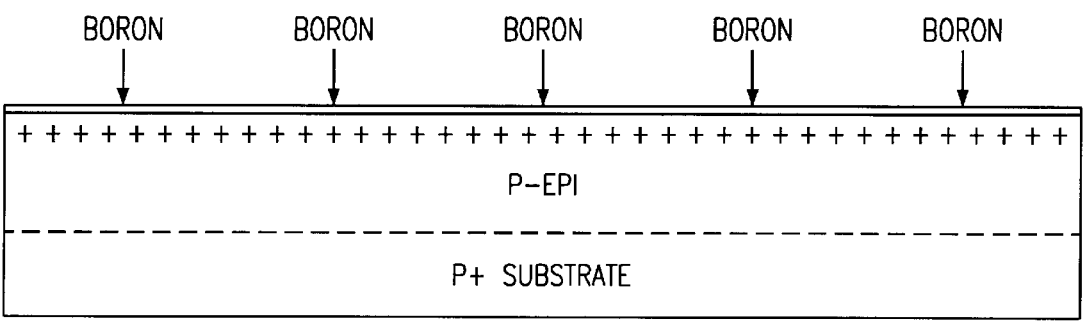

Referring to FIGS. 5(a–c), a layer of nitride is deposited by liquid phase chemical vapor deposition (LPCVD). A photoresist mask which is patterned to the inverse of the moat photoresist mask provides the mask for the boron channel stop implant.

Figure 6A:
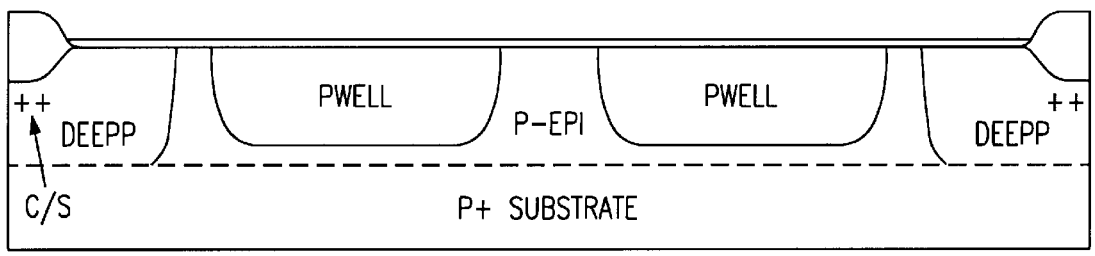
Figure 6B:
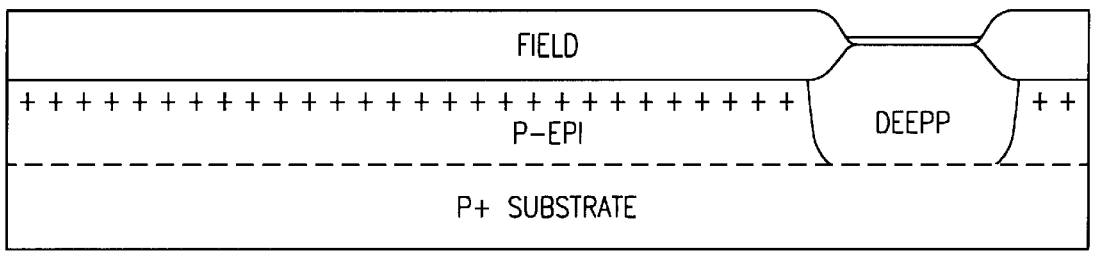
Figure 6C:
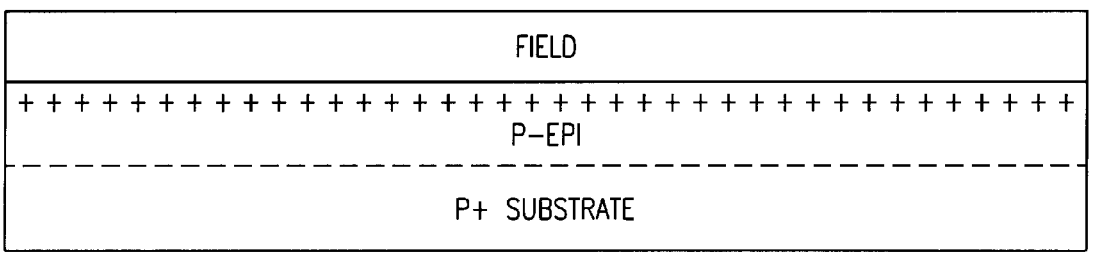

Referring to FIGS. 6(a–c), thermal growth of the field oxidation is performed to provide isolation and to drive in the channel stop diffusion. This is followed by stripping of the nitride layer and growth of the dummy gate oxide.

Poly-0 Structures

Figure 7A:
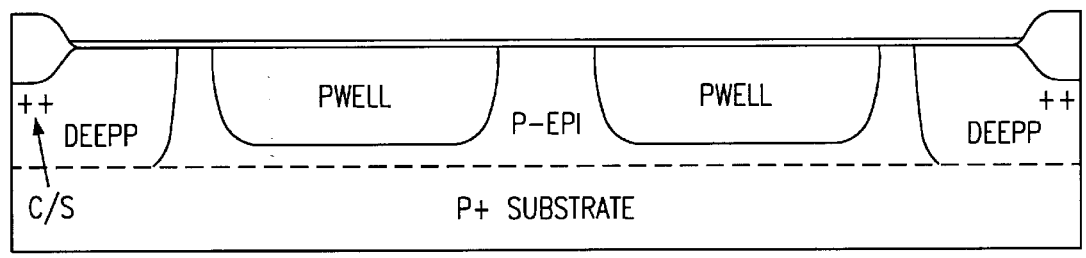
Figure 7B:
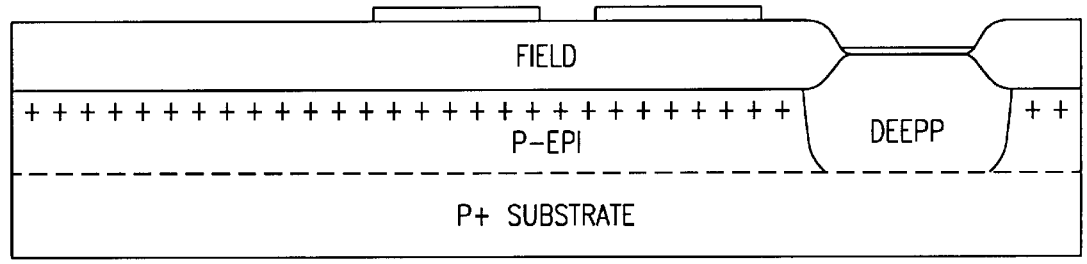
Figure 7C:
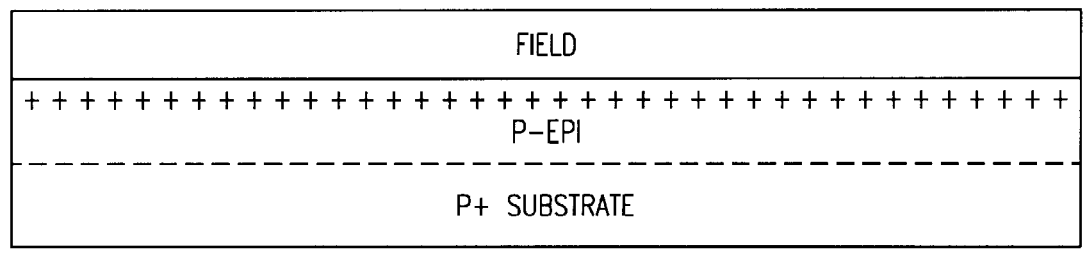

As seen in FIGS. 7(a–c), this is followed by deposition of the first polysilicon layer, the pre-gate or poly-0 layer. This layer, which will form the poly-0 resistor and the lower electrode of the poly-poly capacitor (both seen in FIG. 7(b)), is implanted with phosphorus (e.g. 3.5 e15 ions/square cm at 35 keV) to a high sheet resistance, patterned with a photoresist and etched. At this time, only the body of the resistor is at its final resistance.

Figure 8A:
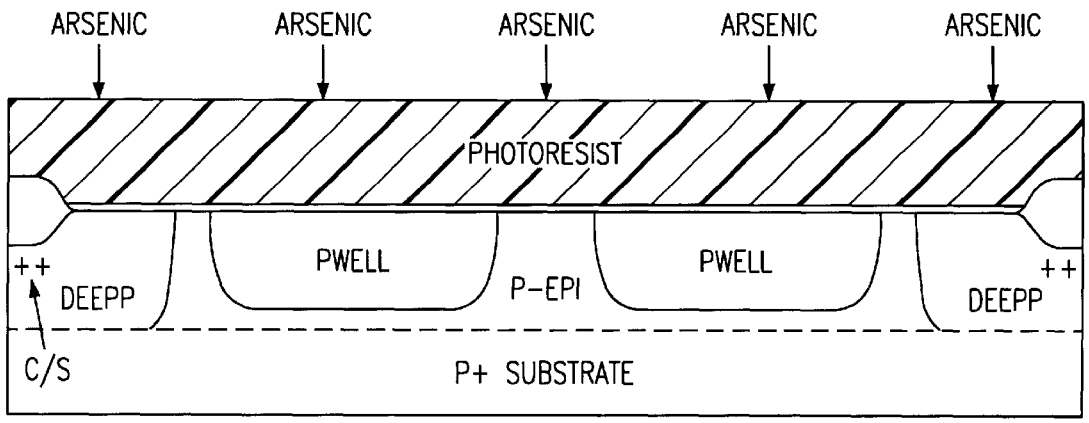
Figure 8B:
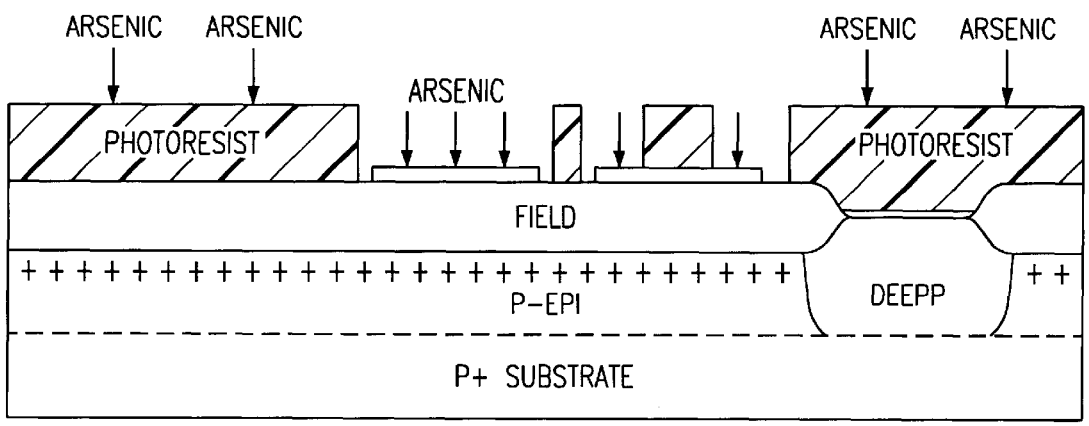
Figure 8C:
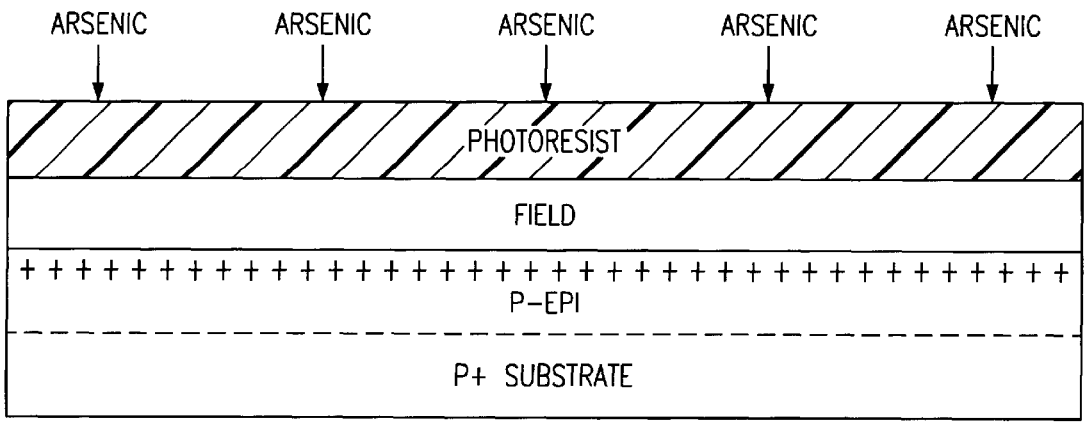
Figure 9A:
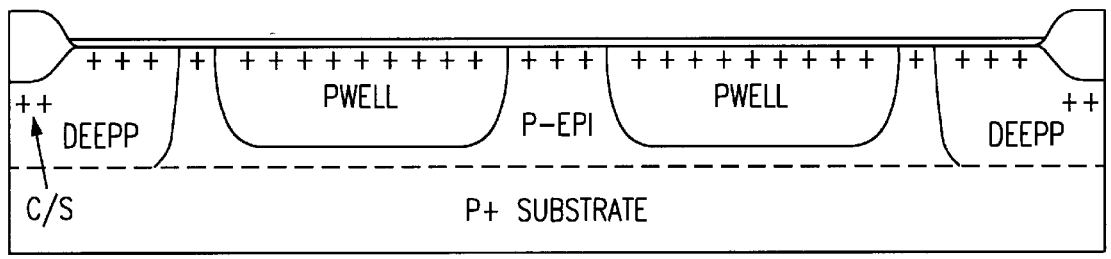
Figure 9B:
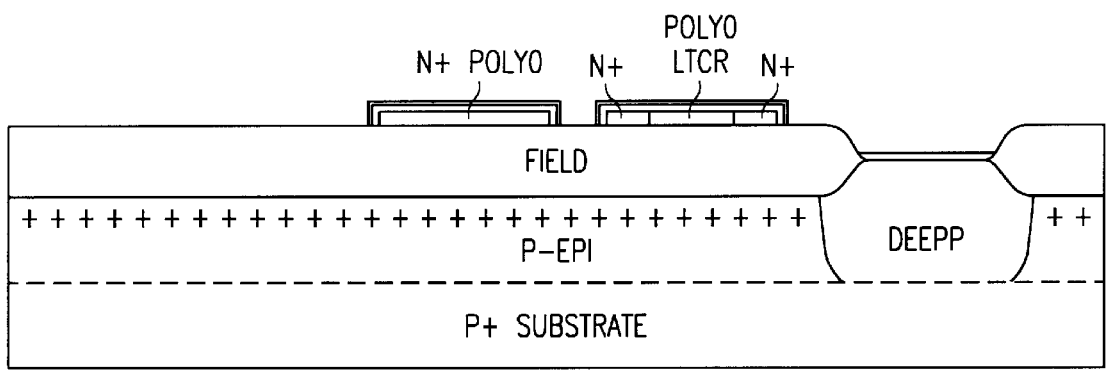
Figure 9C:
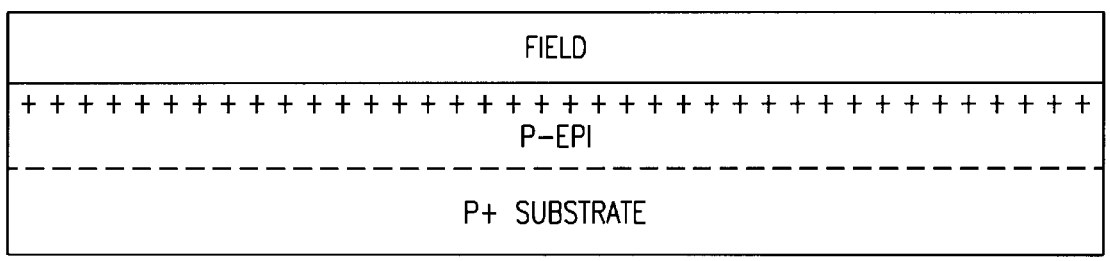
Figure 10A:
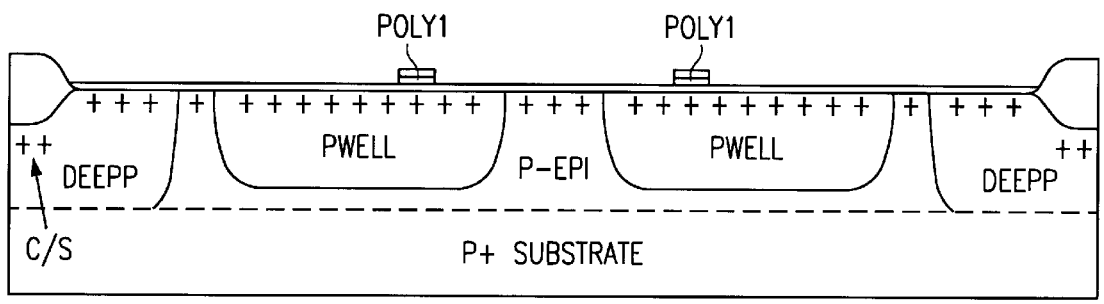
Figure 10B:
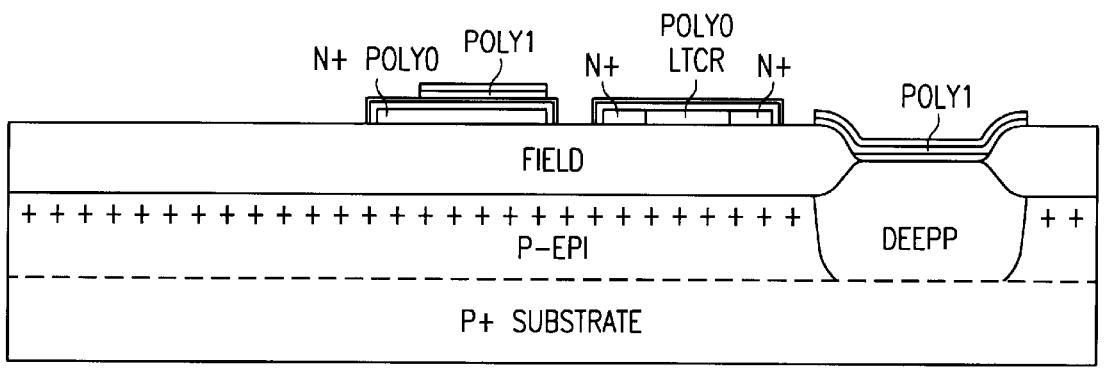
Figure 10C:
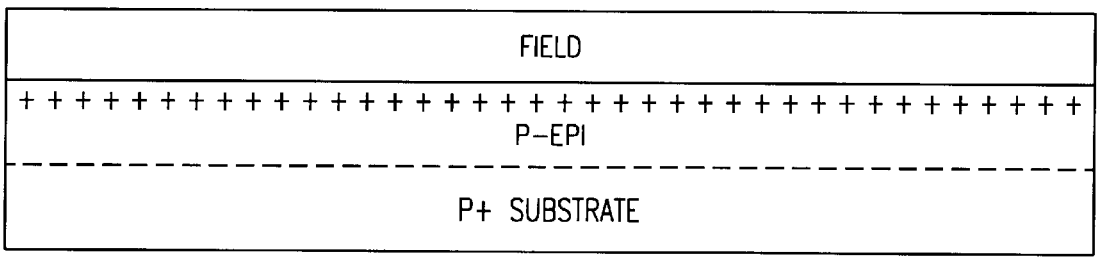

As seen in FIGS. 8(a–c), a photoresist mask is created to expose the lower plate of the poly-poly capacitor, as well as the ends of the resistor, where contacts will be formed. An arsenic implant (e.g. 8.0 e15 ions/square cm and 135 keV) brings the capacitor and resistor contacts to their final doping level.

Once the resist is stripped, a thin oxide is grown on the poly-0 layer. This is followed by deposition of a nitride layer, e.g. 25 nm thick, which is patterned and etched to enclose only the poly-0 components. During thermal growth of the gate oxide, the top portion of the nitride layer is oxidized, giving an oxynitride layer to complete the ONO dielectric formation. A Vt-adjust implant, which uses boron (e.g. 5.5 e11 ions/square cm and 35 keV), completes the structure shown in FIG. 9(a–b).

Transistor Formation

At this point, the gate-level or poly-1 level of polysilicon is deposited. The layer is blanket doped with phosphorus (e.g., using diffusion from POCl3 to achieve a target sheet resistance of 150 ohms/square), then a layer of tungsten silicide WSix is deposited, e.g. by chemical vapor deposition (CVD). Photoresist is used to pattern and etch the WSix/polysilicon stack, followed by an anneal to convert the WSix to WSi2 and an oxidation step to form a thin layer of oxide on the sides of the gate structures, giving the structure of FIGS. 10(a–c). It is noted that this step also forms the ring-shaped top electrode of the poly-poly capacitor, as previously mentioned.

Figure 11A:
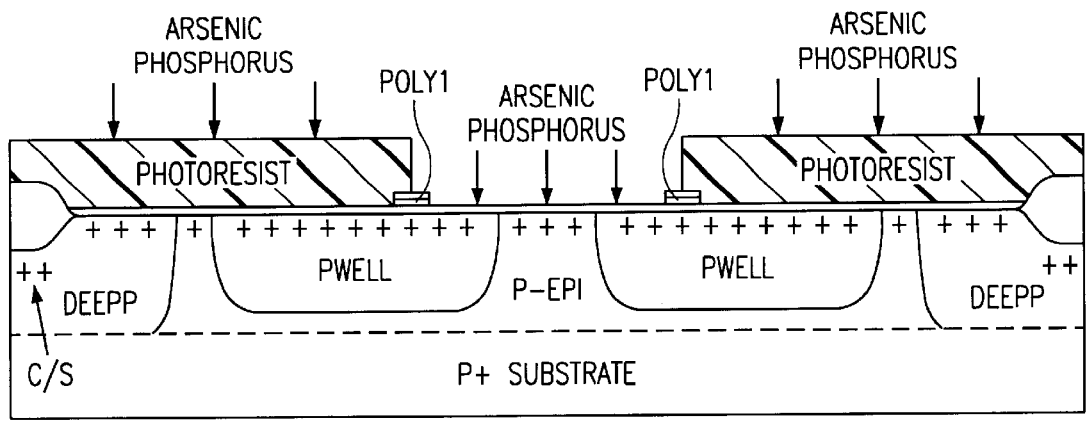
Figure 11B:
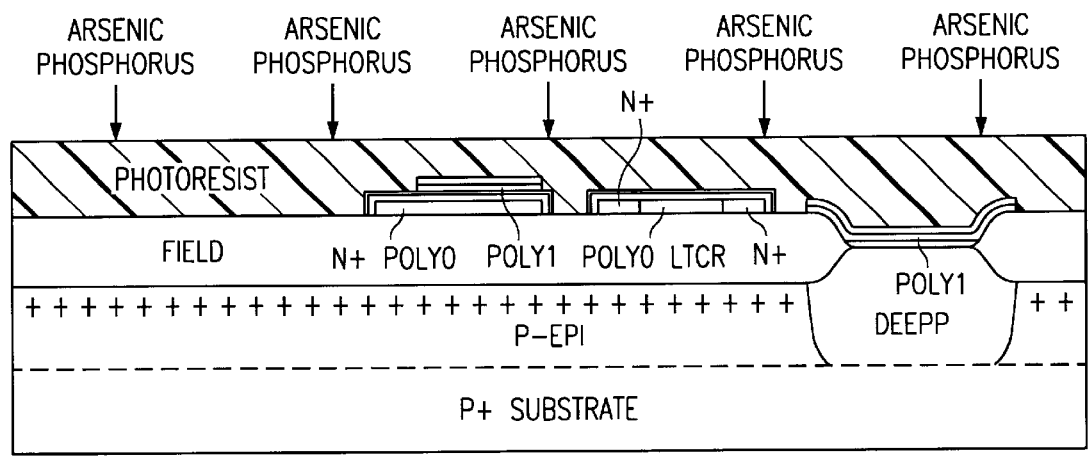
Figure 11C:
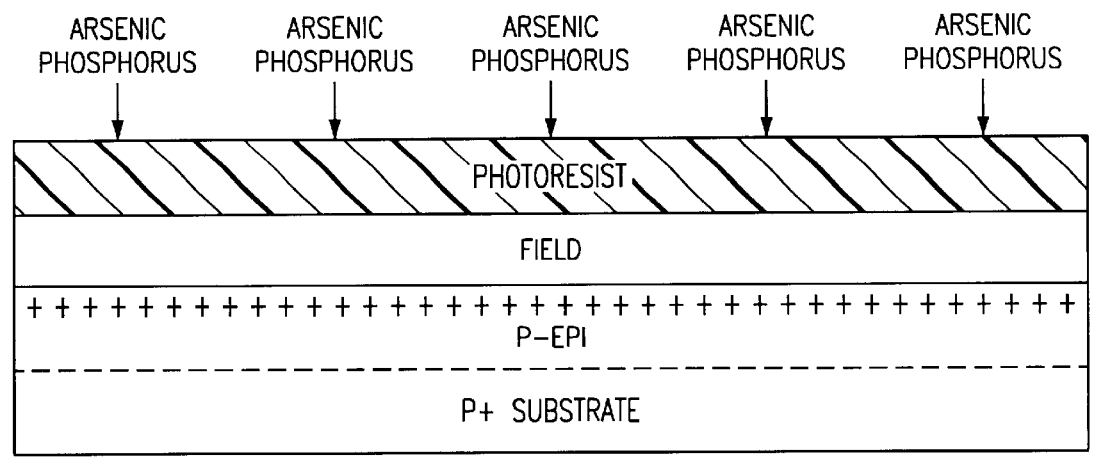

Referring to FIGS. 11(a–c), a layer of photoresist is deposited and patterned to expose only the common drain areas of the transistors, followed by a first source/drain implant with phosphorus, (e.g. 3 e12 ions/square cm at 150 keV) and arsenic (e.g. 2 e12 ions/square cm at 135 keV).

Figure 12A:
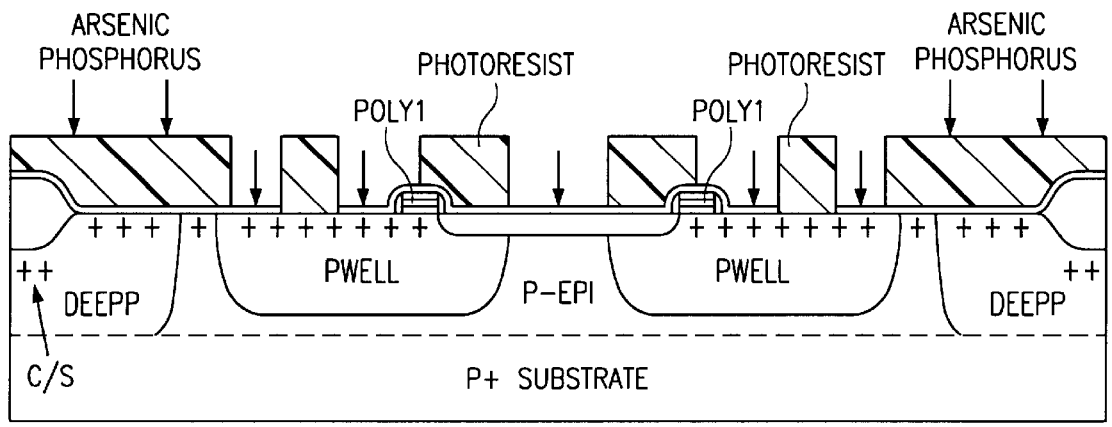
Figure 12B:
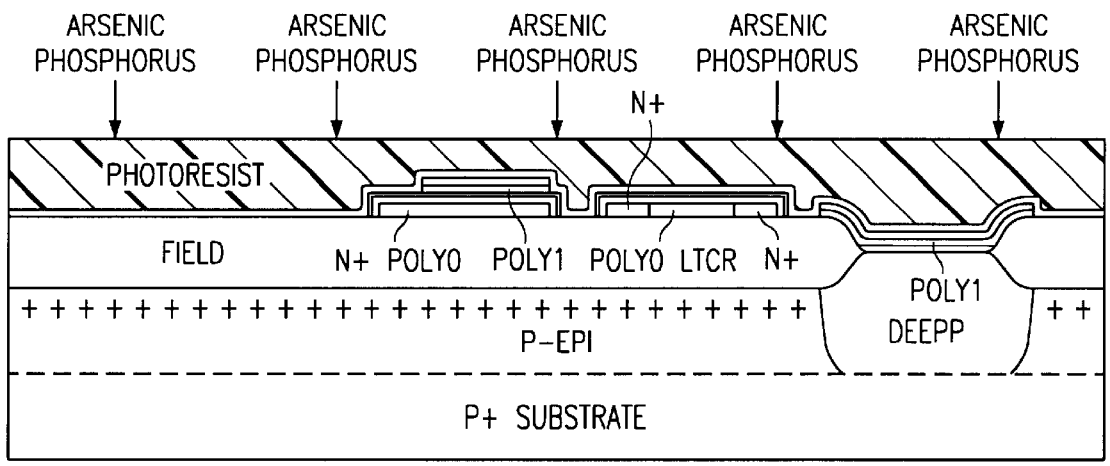
Figure 12C:
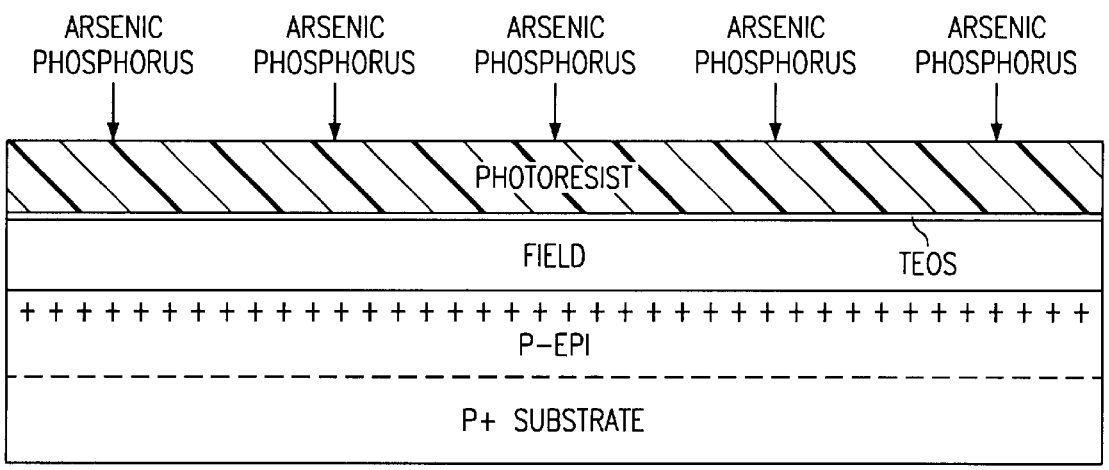

Referring to FIGS. 12(a–c), after ashing of the photoresist, a layer of silicon dioxide is deposited from tetraethyl orthosilicate (TEOS). A non-isotropic etch is performed to form sidewall spacers on the sidewalls of the gate structures. A further deposition of SiO2 from TEOS creates an overall layer covering the wafer. A new photoresist mask is deposited and patterned to expose desired source/drain areas, which are implanted with phosphorus (e.g. 4.7 e14 ions/square cm at 100 keV) and arsenic 3.0 e15 ions/square cm at 135 keV).

Figure 13A:
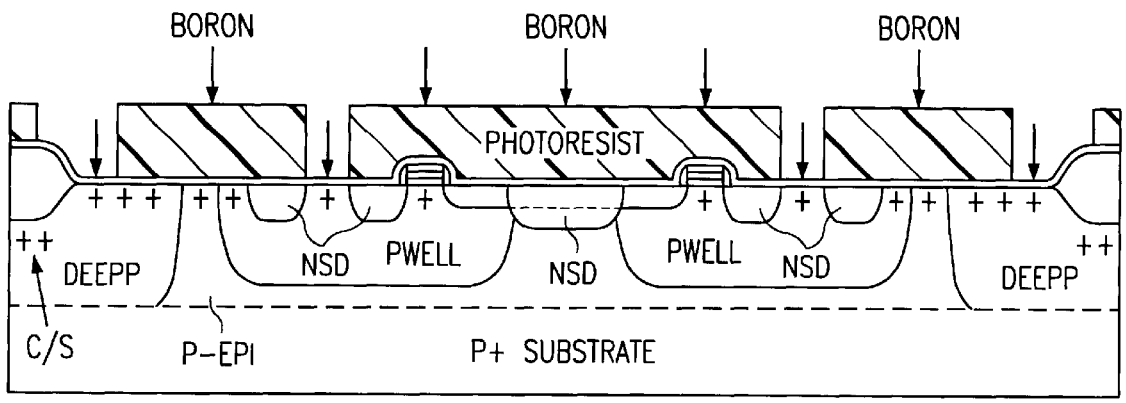
Figure 13B:
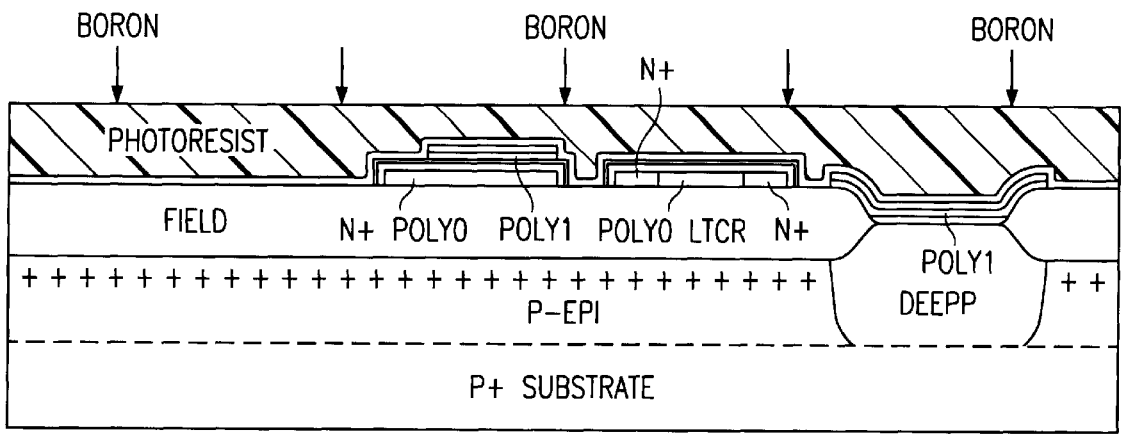
Figure 13C:
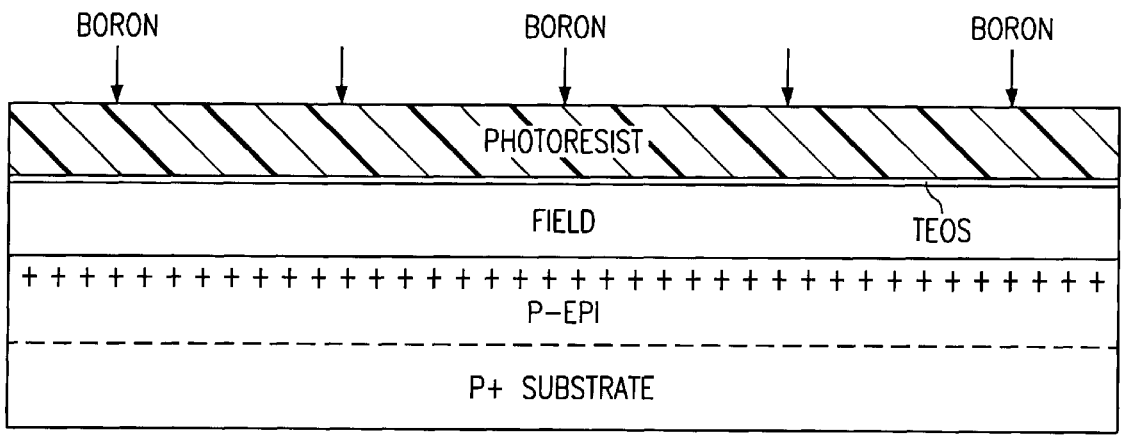
Figure 14A:
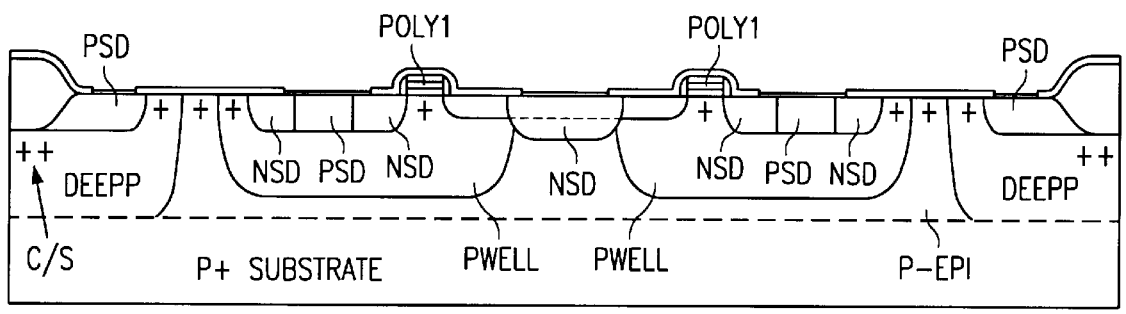
Figure 14B:
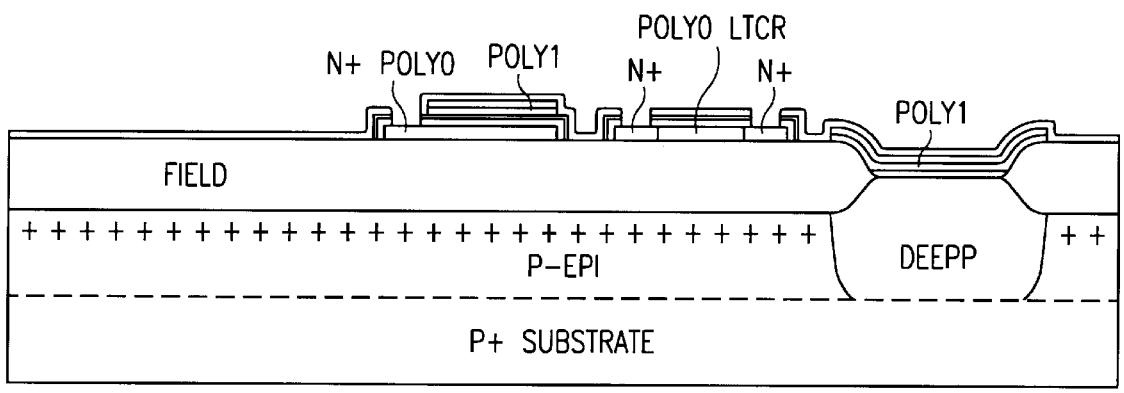
Figure 14C:
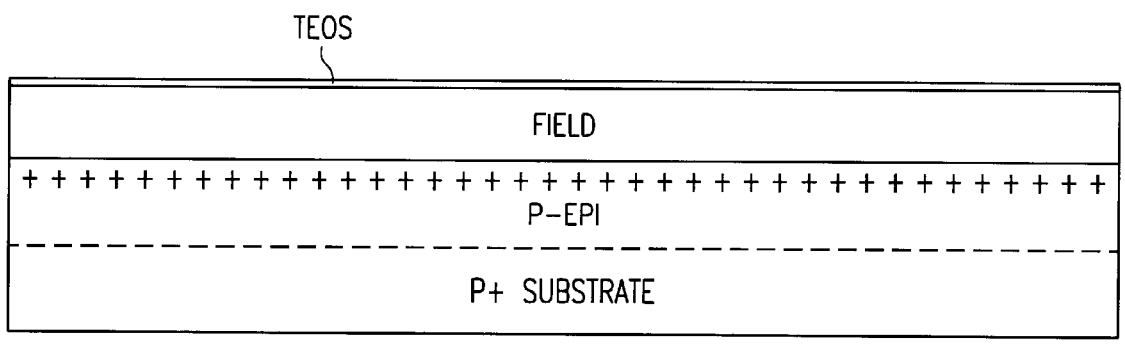

Referring to FIGS. 13(a–c), after ashing of the resist, a further deposition of SiO2 from TEOS is performed to protect the underlying substrate. After an anneal is performed to drive in the source/drain implants, a new photoresist is deposited and patterned to remove the SiO2 from areas where a final implant is desired, followed by an implantation using boron (e.g. 4.6 e15 ions/square cm at 70 keV).

Contacts and Metallizations

After the implants are annealed, a photoresist layer is deposited and patterned to expose those area on the substrate, capacitor, and resistor where contacts are desired. The oxide is removed in these areas, as is the nitride overlying the resistor and capacitor contact points. A layer of platinum is deposited and annealed to form platinum silicide contacts, followed by an aqua regia etch to remove unreacted platinum, giving the structure shown in FIGS. 14(a–c).

Figure 15A:
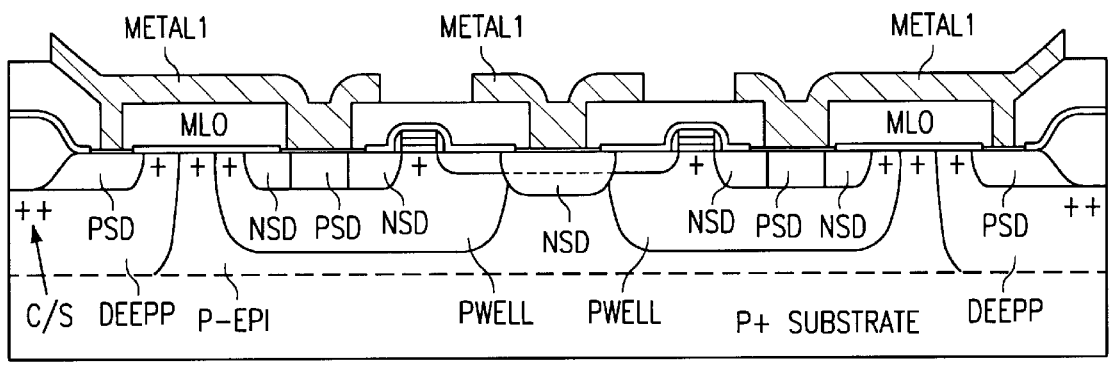
Figure 15B:
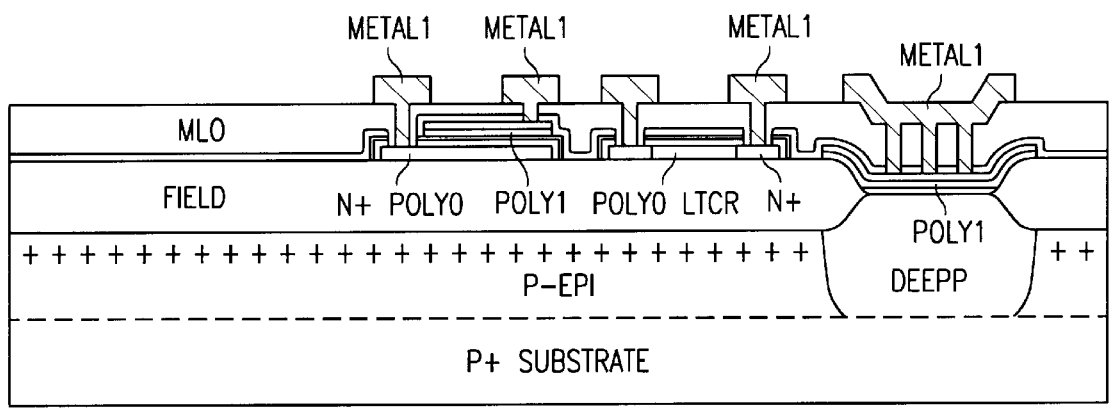
Figure 15C:
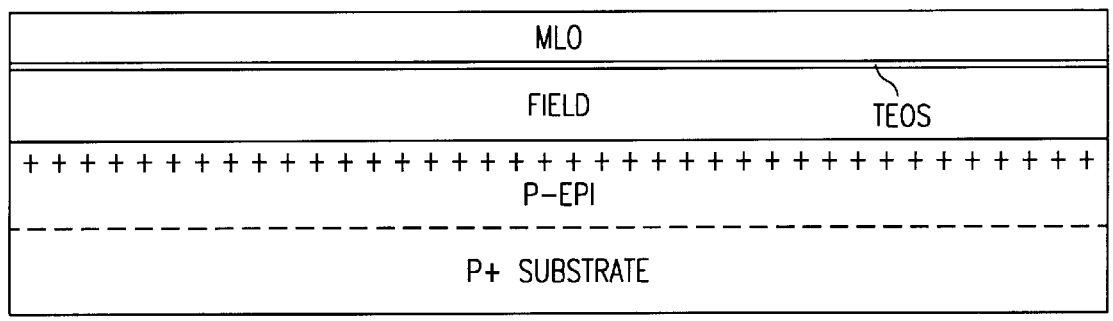
Figure 16A:
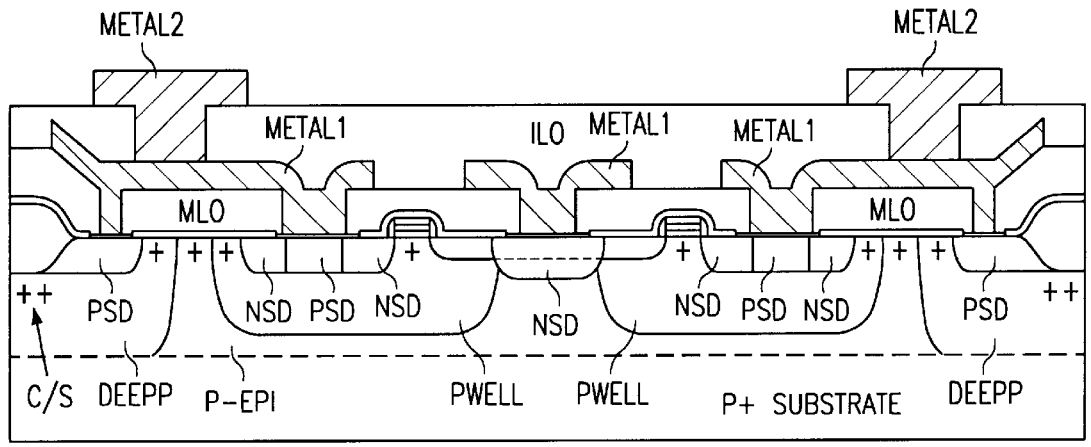
Figure 16B:
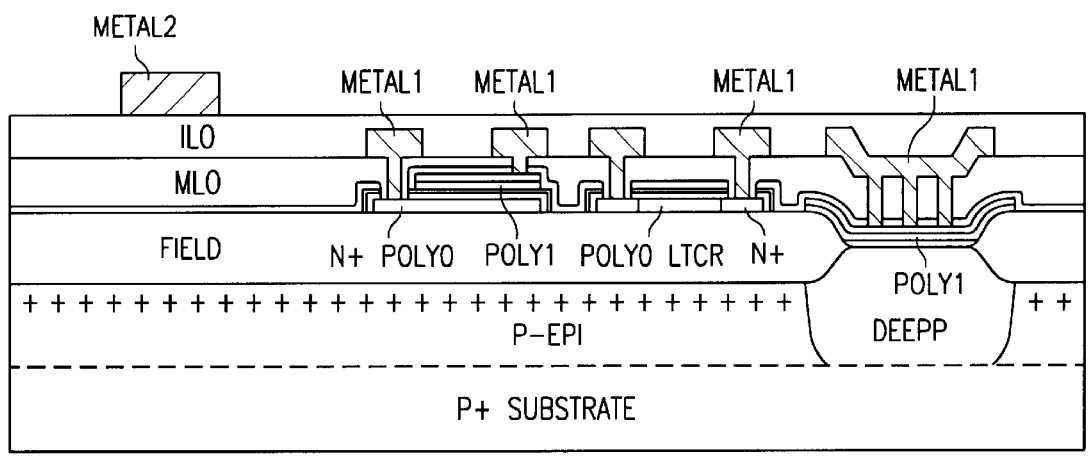
Figure 16C:
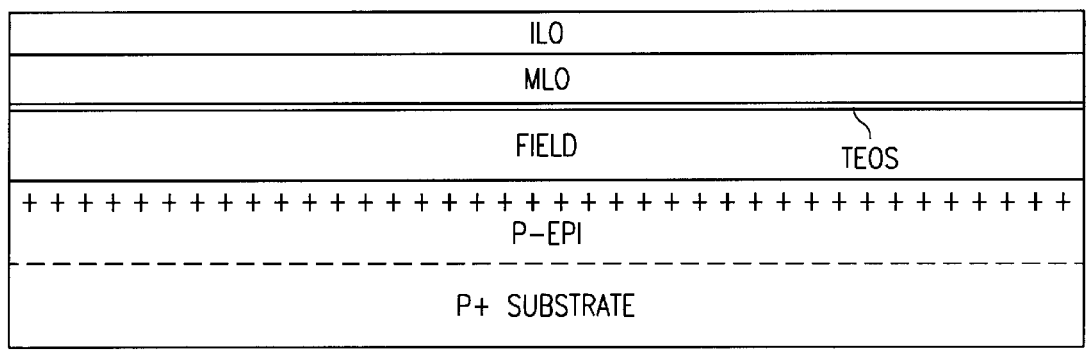

FIGS. 15(a–c) generally show the first metallization layer, which is formed as follows. A dielectric (or several layers of doped and undoped dielectric) is deposited to a depth of 1 micron, then planarized using chemical-mechanical polishing to provide a level surface for lithography. A photoresist is deposited and patterned to expose the contact areas, which are then etched to form the contact holes. A first layer of aluminum is deposited to form the metal-1 layer, which is then patterned with photoresist and etched to form the desired interconnects on this level.

A layer of spin-on glass (SOG) is deposited and cured to form an inter-level oxide. Photoresist is deposited and patterned to expose the areas where vias are desired, then vias are etched. A second layer of aluminum is deposited, then etched to form the interconnects necessary for this level and the metal-2 plate overlying the capacitor (also not shown), giving the structure shown in FIGS. 16(a–c).

Protective Overcoat and Topside Devices and Structures

The final figures show the formation of the protective overcoat (PO) layer, as well as structures which are formed outside of this overcoat.

Figure 17A:
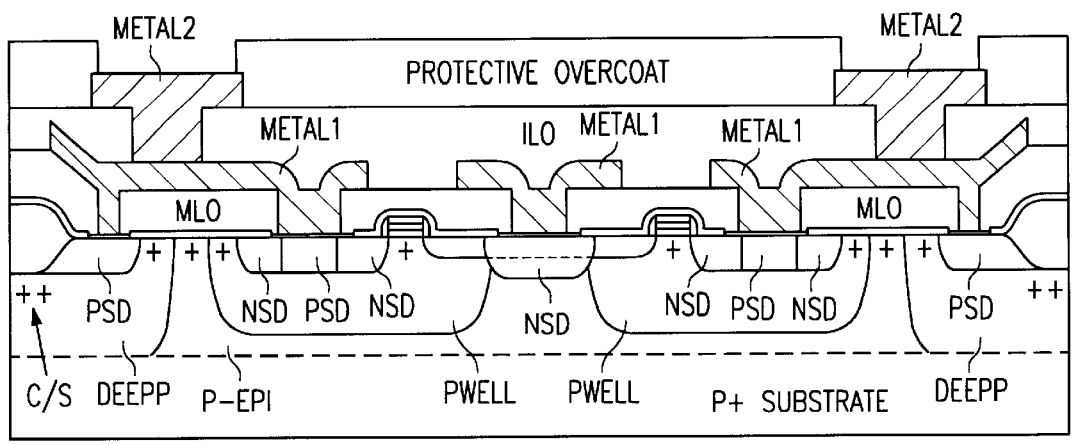
Figure 17B:
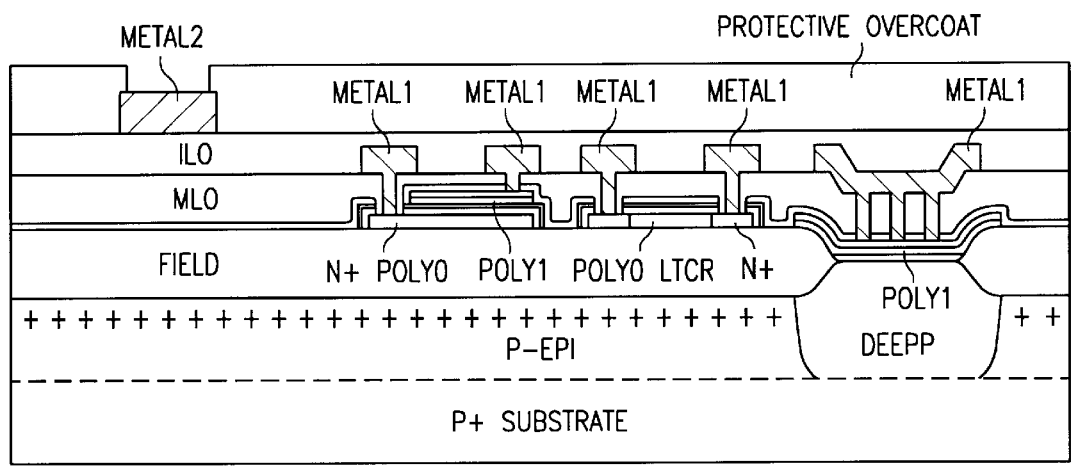
Figure 17C:
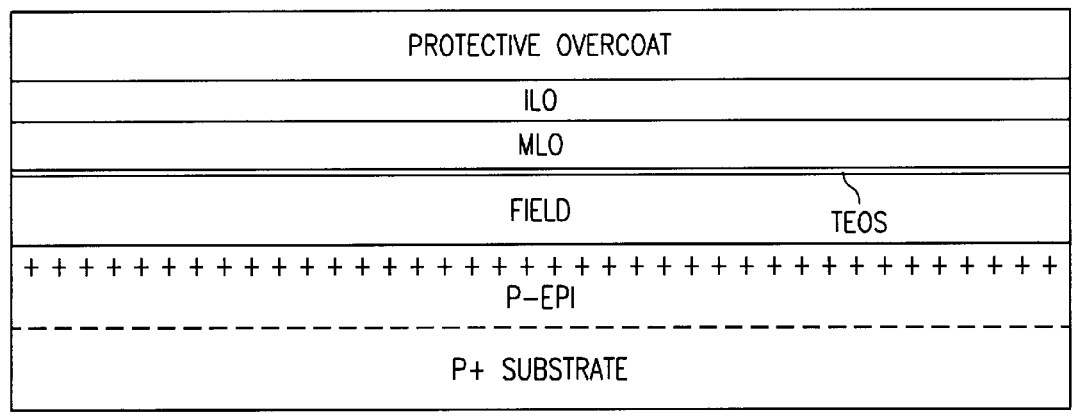
Figure 18A:
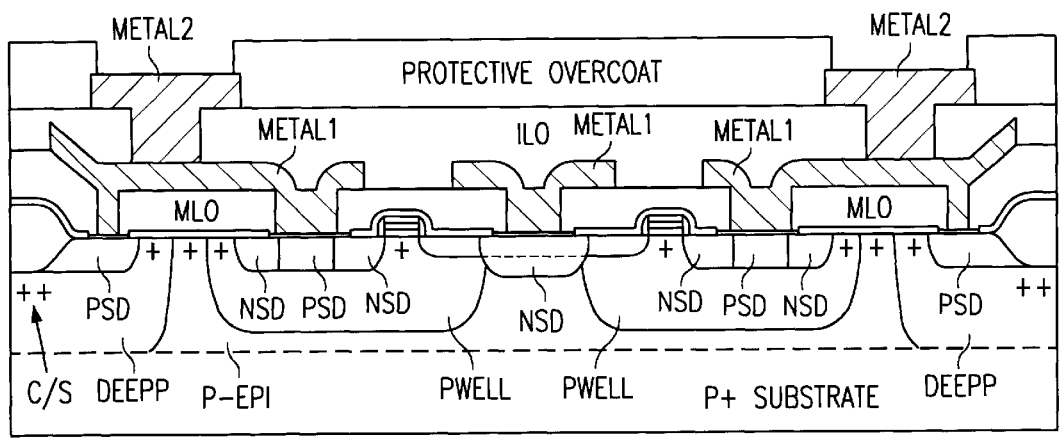
Figure 18B:
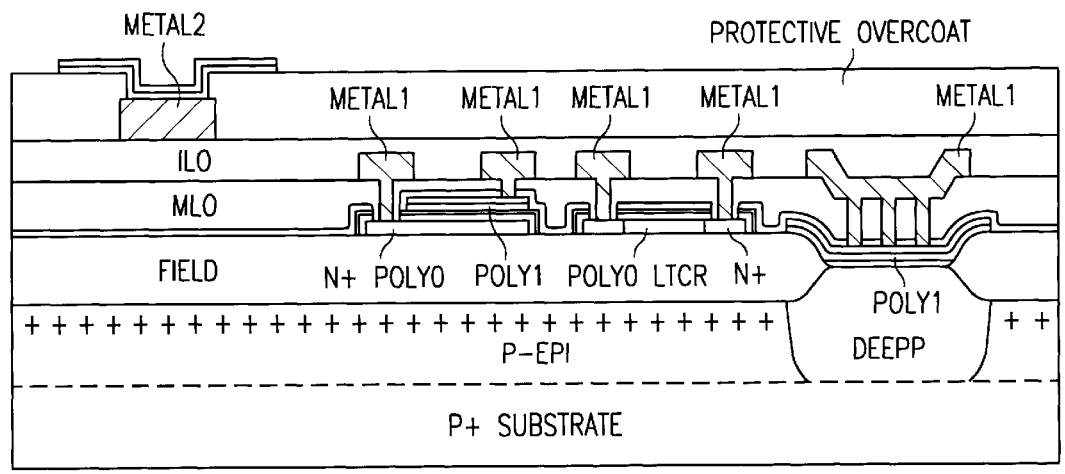
Figure 18C:
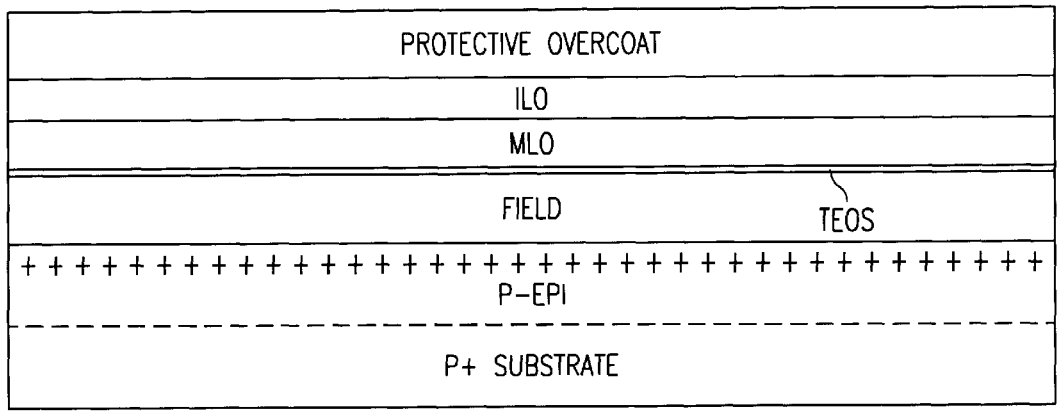

As seen in FIGS. 17(a–c), a protective overcoat of silicon nitride is deposited to a depth of 1 micron. This overcoat is then masked by a layer of photoresist, while connections to the metal-2 level are etched.

In order to form a high-Q capacitor partially outside the PO, a plasma-enhanced chemical-vapor deposition (PECVD) nitride is deposited to form a capacitor interlevel dielectric (ILD), followed by deposition of a layer of titanium tungsten approximately 300 nm thick. These two levels are masked and etched to give the structure shown in FIGS. 18(a–c).

Finally, a further blanket layer of titanium tungsten is deposited to serve as an etch stop for the copper layer to follow, then a seed layer is deposited to grow the layer of copper outside of the protective overcoat. Areas where no metal growth is desired are covered by a patterned photoresist, and a thick layer of copper is electrolytically grown to a thickness, in the presently preferred embodiment, of about 11–12 microns, giving the structure of FIGS. 19(a–c). This copper metal top forms the top electrode for the high-Q capacitor seen in FIG. 19(b) and also forms the metal-top inductor as shown in FIG. 19(c).

The resist is stripped and the exposed portions of the seed layer are etched, followed by application of a protective tape to the frontside of the chip and metallization of the backside of the wafer, giving the structures of FIGS. 20(a–c).

Figure 21A:
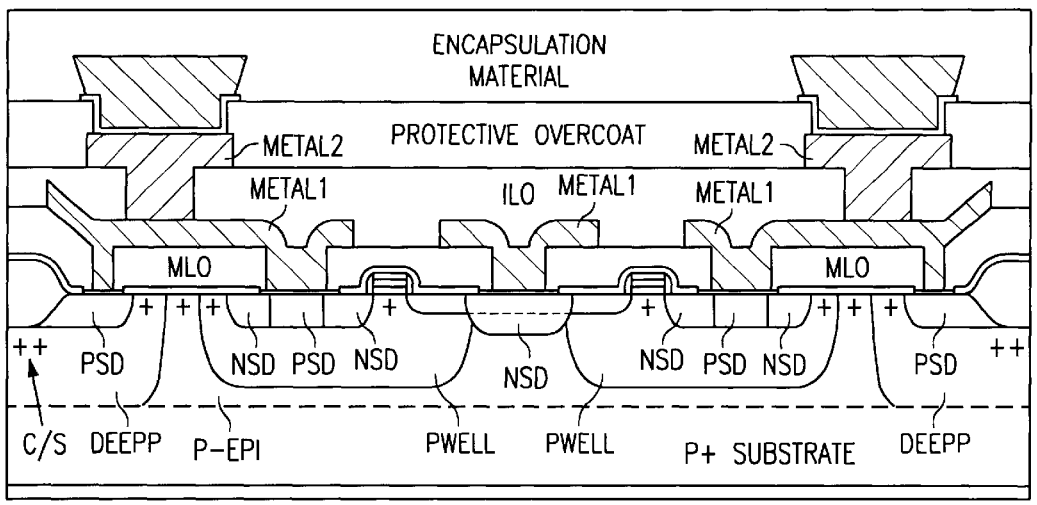
Figure 21B:
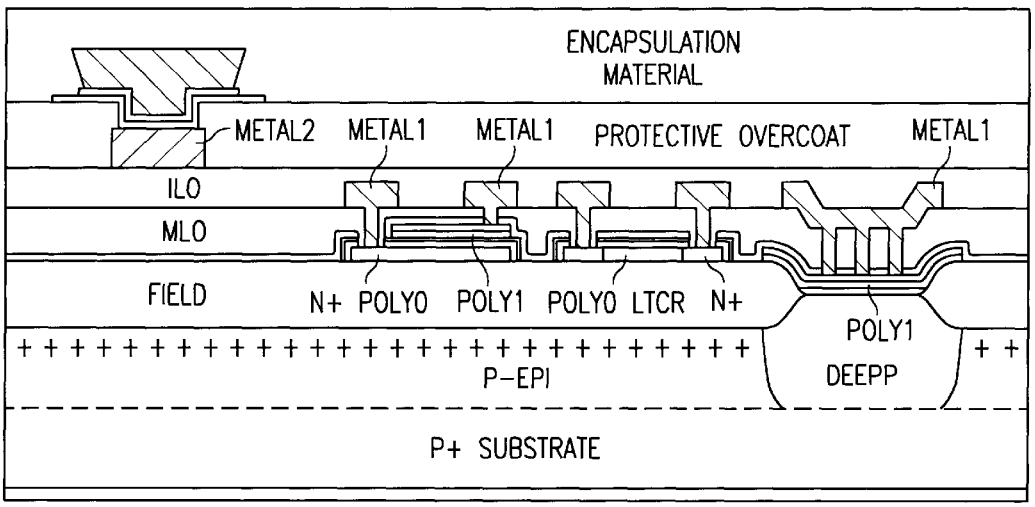
Figure 21C:
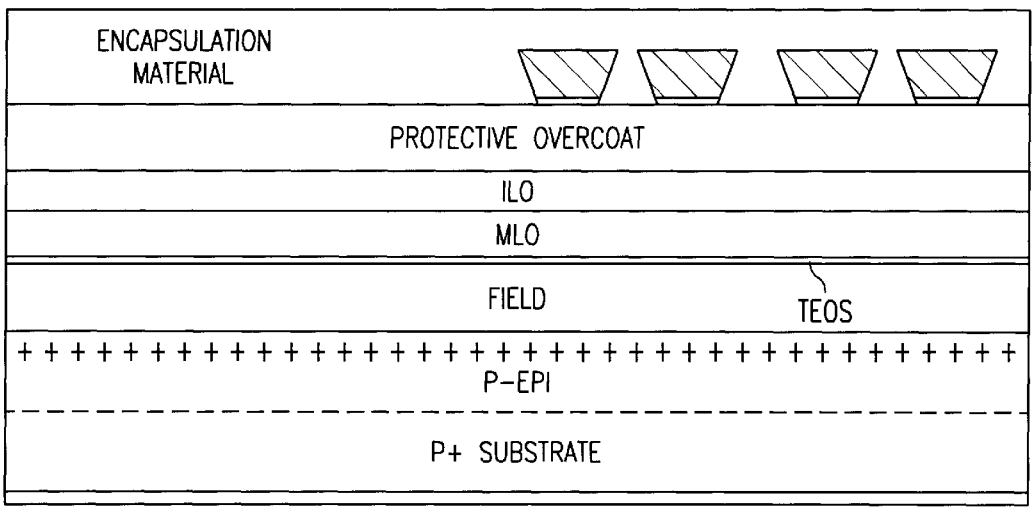

Once connections from bond pads to external wiring is made, the entire chip will then be packaged, e.g., by encapsulation in plastic, as seen in FIGS. 21(a–c).

Device Layout

Figure 22:
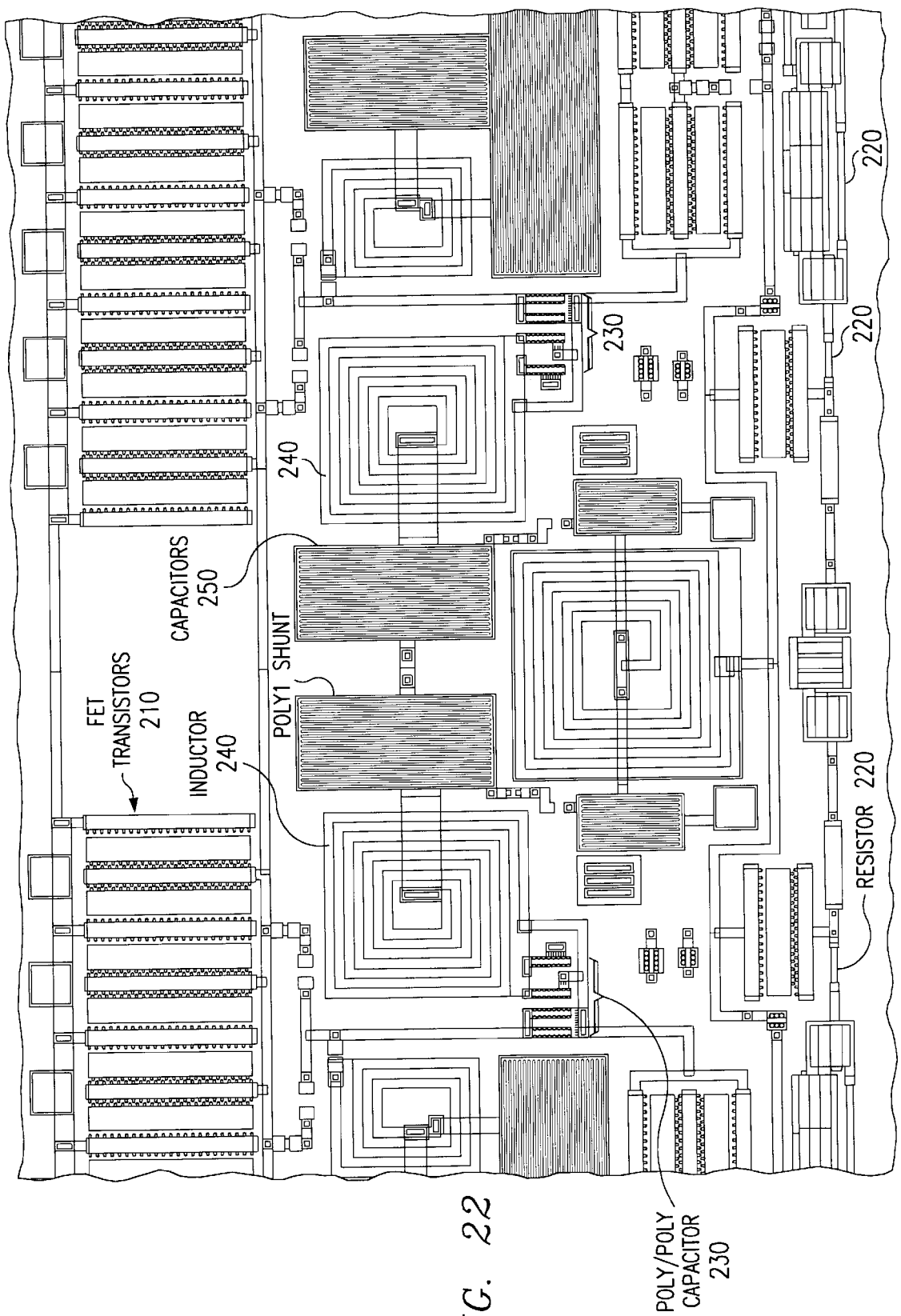
FIGS. 22–23 are device layout views in accordance with the present disclosure.
Figure 23:
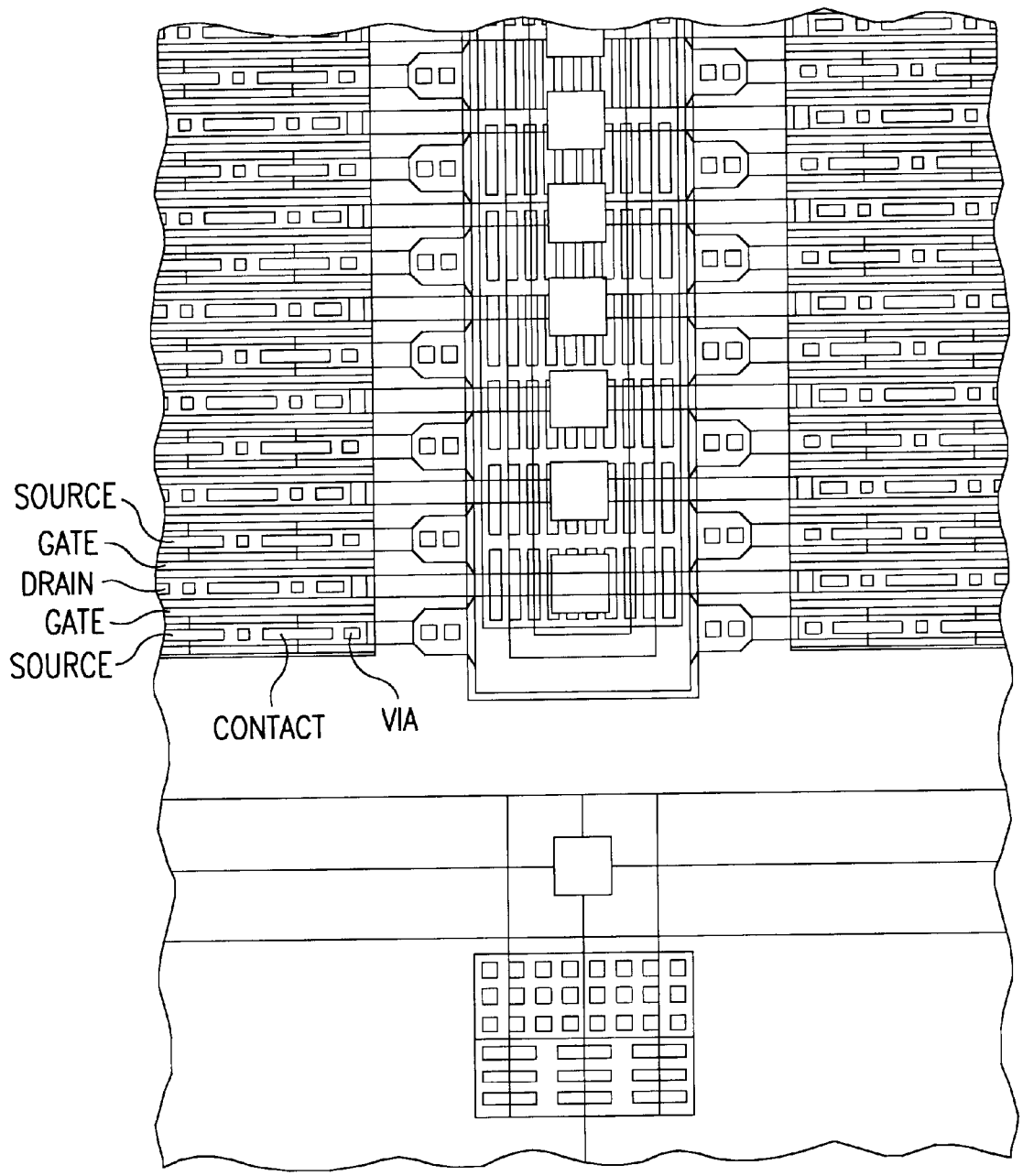
Figure 24:
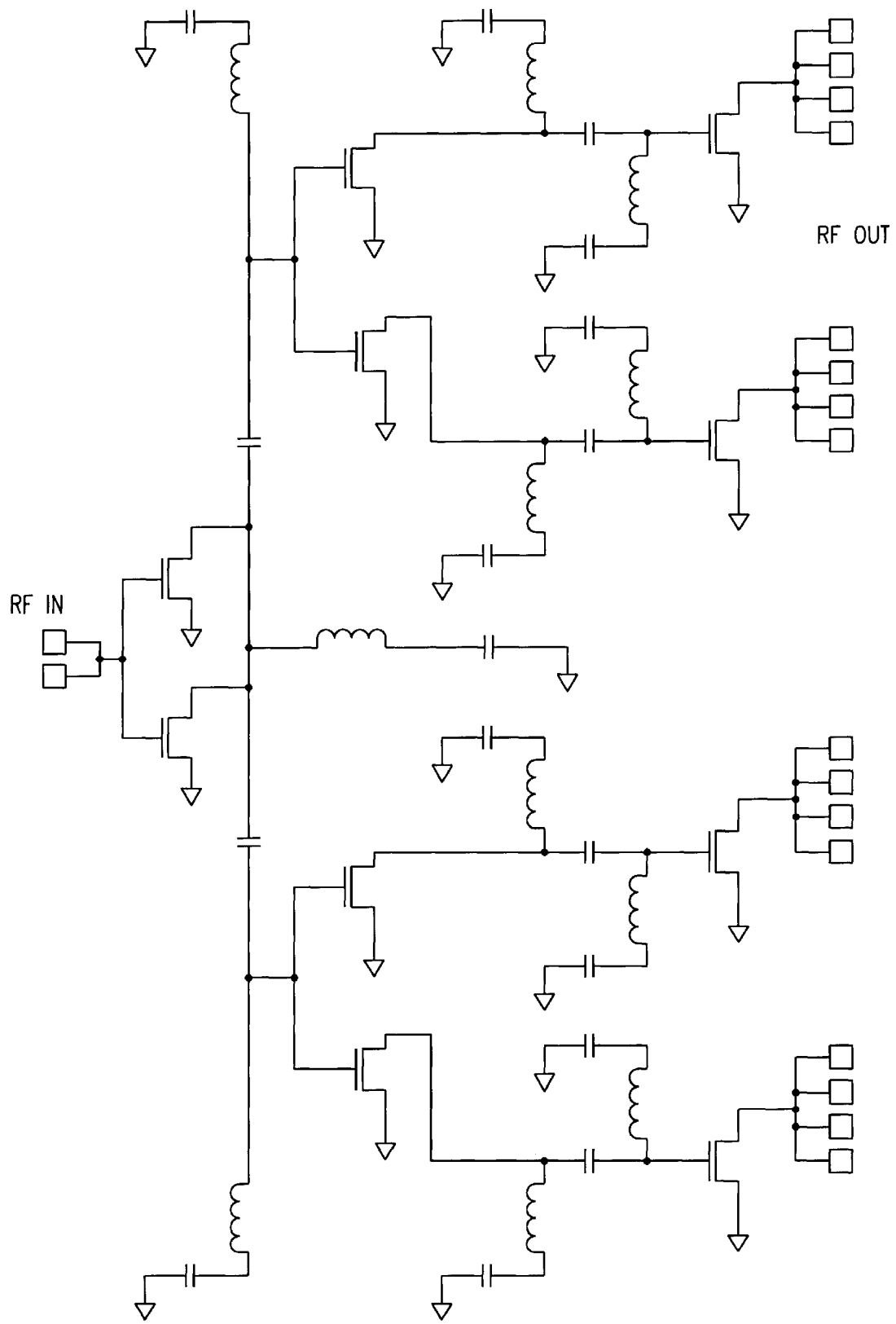
FIG. 24 is a schematic of an RF-MOS circuit which can utilize the disclosed devices and processes.

FIGS. 22 through 23 are device layout views in accordance with the present invention, depicting structures fabricated by the process steps described in relation to FIGS. 1(a–c) through 21(a–c). FIG. 22 shows arrays of field-effect transistors 210, poly-0/poly-1 resistors 220, poly-0/poly-1 capacitor arrays 230, the squared spiral shape of the inductors 240, and the poly-1/shunt capacitors 250, while FIG. 23 shows a close-up of an array of transistors.

While the principles of the present invention are disclosed herein, it will be recognized that various departures may be undertaken in the practice of this invention. The scope of the invention is not intended to be limited to the particular structures and methods disclosed herein.

Alternate Embodiment:

In an alternative embodiment, the thick top metal could be formed using a screen-print method.

Alternate Embodiment:

In alternative embodiments, other low-resistance metals, such as gold may be used to form the thick metal layer of the high-Q capacitor and the top metal inductor.

Alternate Embodiment:

In an alternative embodiment, other thicknesses of metal may be used. For example, a thickness of around 6 microns (about 3 times the skin depth of copper) may be used. (Note, the skin depth is dependant upon frequency.) Reducing the thickness reduces the pitch which results in better inductances.

According to a disclosed class of innovative embodiments, there is provided: An integrated circuit structure, comprising: a first circuit portion enclosed by a protective overcoat with bond pad openings; an inductor formed of a low resistance material on said protective overcoat.

According to another disclosed class of innovative embodiments, there is provided: An integrated circuit structure, comprising: a first circuit portion enclosed by a protective overcoat with bond pad openings; a low-resistance structure which forms one electrode of a capacitor, said low-resistance structure at least partially overlying said protective overcoat.

According to another disclosed class of innovative embodiments, there is provided: An integrated circuit structure, comprising: a first circuit portion enclosed by a protective overcoat with bond pad openings; an inductor formed of a low-resistance material, said inductor being outside said protective overcoat; an encapsulating material, said encapsulating material encapsulating both said first circuit portion, said protective overcoat, and said low-resistance structure.

According to another disclosed class of innovative embodiments, there is provided: An integrated circuit structure, comprising: a first circuit portion enclosed by a protective overcoat with bond pad openings, said first circuit portion including a metallization layer which forms a first electrode of a capacitor; a low-resistance structure which forms a second electrode of a capacitor, said low-resistance structure being at least partially outside said protective overcoat; an encapsulating material, said encapsulating material encapsulating both said first circuit portion, said protective overcoat, and said low-resistance structure.

According to another disclosed class of innovative embodiments, there is provided: An integrated circuit structure, comprising an inductor, a high-Q capacitor, and a power transistor on the same chip.

According to another disclosed class of innovative embodiments, there is provided: A fabrication method, comprising the steps of: (a.) covering a first circuit portion with a protective overcoat; (b.) forming bond pad openings through said protective overcoat; and (c.) forming an inductor of a low-resistance material on an exposed surface of said protective overcoat.

According to another disclosed class of innovative embodiments, there is provided: A fabrication method, comprising the steps of: (a.) forming a first circuit portion which includes a first electrode of a capacitor; (b.) covering said first circuit portion with a protective overcoat; (c.) forming openings through said protective overcoat including bond pad openings and an opening at said first electrode; (d.) depositing a capacitor dielectric over exposed portions of said first electrode; and (e.) forming a second electrode of said capacitor overlying said first electrode, said second electrode at least partially overlying said protective overcoat.

According to another disclosed class of innovative embodiments, there is provided: A method of fabrication, comprising the step of forming an inductor, a high-Q capacitor, and a power transistor on a single semiconductor chip.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should also be noted that the number of layers of metallization described above does not implicitly limit any of the claims, which can be applied to processes and structures with more or fewer layers.

It should be noted that any other metal that is capable of thick metallization would also work in place of copper for the metal-top, e.g., aluminum would also work as the metal-top although it would take much time and effort to planarize.

It is also noteworthy that resistors can be placed on top of the protective overcoat to form RLC circuits.

What is claimed is:

1. A fabrication method, comprising the steps of:

(a.) forming a first circuit portion which includes a first electrode of a capacitor;

(b.) covering said first circuit portion with a protective overcoat;

(c.) forming openings through said protective overcoat including bond pad openings and an opening at said first electrode;

(d.) depositing a capacitor dielectric over exposed portions of said first electrode; and (e.) forming a second electrode of said capacitor overlying said first electrode, said second electrode at least partially overlying said protective overcoat.

* * * * *